United States Patent
Chen et al.

(10) Patent No.: US 7,932,569 B2
(45) Date of Patent: Apr. 26, 2011

(54) MICROMECHANICAL DEVICE WITH MICROFLUIDIC LUBRICANT CHANNEL

(75) Inventors: Dongmin Chen, Saratoga, CA (US); William Spencer Worley, Half Moon Bay, CA (US); Hung-Nan Chen, Kaohsiung Hsien (TW)

(73) Assignee: Miradia, Inc., Santa Clara, CA (US)

( * ) Notice: Subject to any disclaimer, the term of this patent is extended or adjusted under 35 U.S.C. 154(b) by 841 days.

(21) Appl. No.: 11/862,174

(22) Filed: Sep. 26, 2007

(65) Prior Publication Data

US 2008/0179696 A1 Jul. 31, 2008

Related U.S. Application Data

(60) Provisional application No. 60/847,831, filed on Sep. 27, 2006.

(51) Int. Cl.
  *H01L 29/84* (2006.01)
  *H01L 23/10* (2006.01)
(52) U.S. Cl. .................. 257/415; 257/E29.324
(58) Field of Classification Search .......... 257/414–420, 257/E29.324
  See application file for complete search history.

(56) References Cited

U.S. PATENT DOCUMENTS

| | | | |
|---|---|---|---|
| 6,806,993 B1 | 10/2004 | Adams et al. | |
| 6,921,680 B2 * | 7/2005 | Robbins | 438/51 |
| 6,946,728 B2 | 9/2005 | Chen et al. | |
| 6,956,283 B1 | 10/2005 | Peterson | |
| 6,958,846 B2 | 10/2005 | Huibers et al. | |
| 6,979,893 B2 * | 12/2005 | Dunphy et al. | 257/682 |
| 7,335,535 B2 * | 2/2008 | Dunphy et al. | 438/125 |
| 7,430,359 B2 * | 9/2008 | Chen et al. | 385/147 |
| 7,616,370 B2 * | 11/2009 | Chen et al. | 359/290 |
| 7,763,489 B2 * | 7/2010 | Chen et al. | 438/51 |
| 2005/0212067 A1 * | 9/2005 | Duboc et al. | 257/415 |
| 2008/0080832 A1 * | 4/2008 | Chen et al. | 385/147 |
| 2008/0081427 A1 * | 4/2008 | Chen et al. | 438/381 |
| 2008/0179696 A1 * | 7/2008 | Chen et al. | 257/415 |
| 2008/0248613 A1 * | 10/2008 | Chen et al. | 438/115 |

OTHER PUBLICATIONS

International Search Report. Feb. 28, 2008.

* cited by examiner

*Primary Examiner* — Evan Pert
(74) *Attorney, Agent, or Firm* — Patterson & Sheridan, LLP

(57) ABSTRACT

A micromechanical device assembly includes a micromechanical device enclosed within a processing region and a lubricant channel formed through an interior wall of the processing region and in fluid communication with the processing region. Lubricant is injected into the lubricant channel via capillary forces and held therein via surface tension of the lubricant against the internal surfaces of the lubrication channel. The lubricant channel containing the lubricant provides a ready supply of fresh lubricant to prevent stiction from occurring between interacting components of the micromechanical device disposed within the processing region.

25 Claims, 23 Drawing Sheets

FIG. 5A
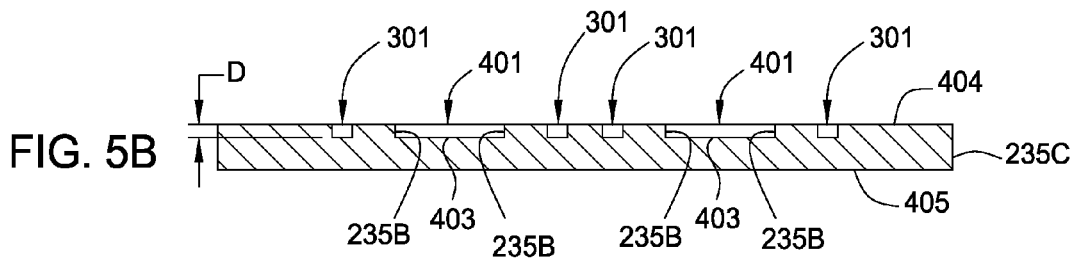
FIG. 5B
FIG. 5C
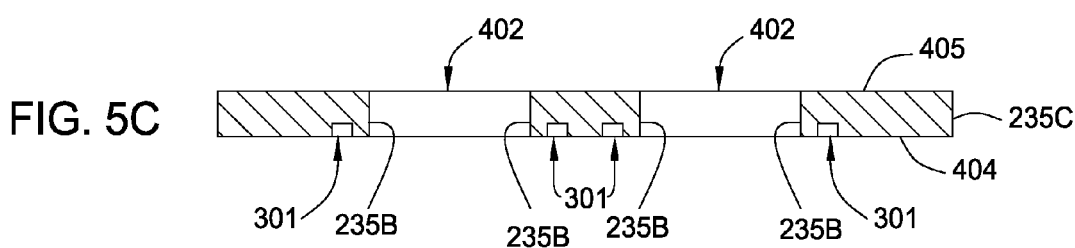
FIG. 5D
FIG. 5E
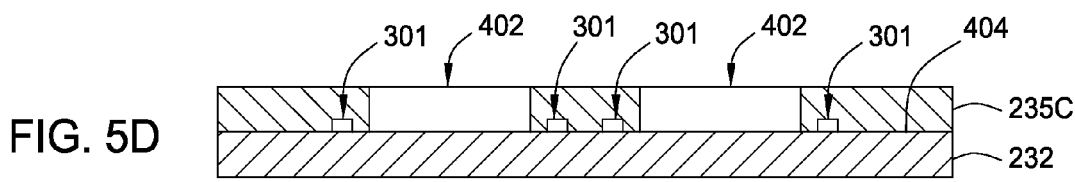
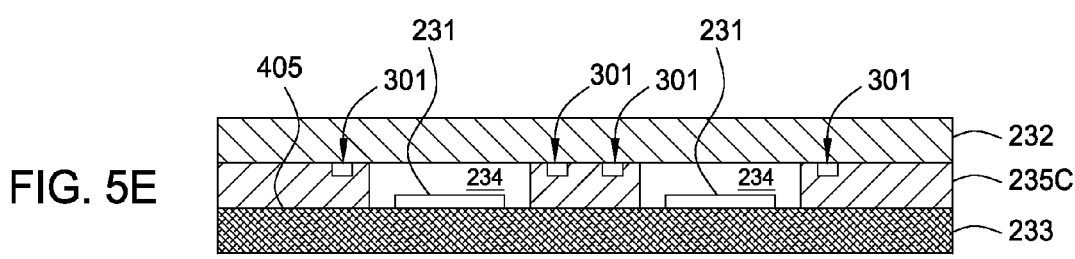
FIG. 5F
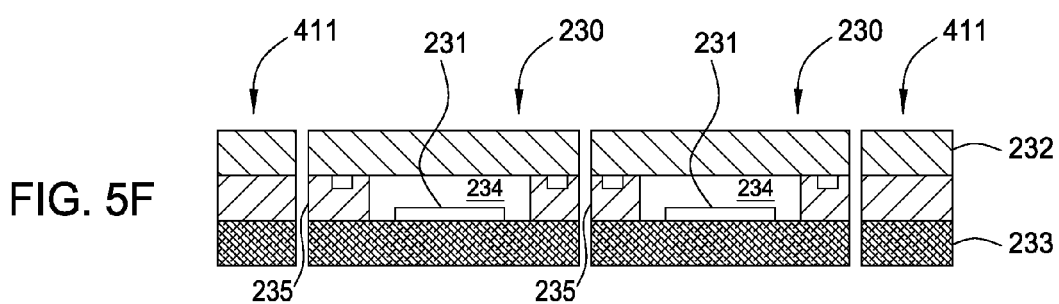

US 7,932,569 B2

MICROMECHANICAL DEVICE WITH MICROFLUIDIC LUBRICANT CHANNEL

CROSS-REFERENCE TO RELATED APPLICATIONS

This application claims the benefit of U.S. Provisional Patent Application Ser. No. 60/847,831, filed Sep. 27, 2006, entitled "Method of Sealing a Microfluidic Lubricant Channel Formed in a Micromechanical Device," which is herein incorporated by reference.

BACKGROUND OF THE INVENTION

1. Field of the Invention

Embodiments of the present invention relate generally to micro-electro-mechanical and nano-electro-mechanical systems and more specifically to such systems having one or more microfluidic lubricant channels.

2. Description of the Related Art

As is well known, atomic level and microscopic level forces between device components become far more critical as devices become smaller. Problems related to these types of forces are quite prevalent with micromechanical devices, such as micro-electro-mechanical systems (MEMS) and nano-electro-mechanical systems (NEMS). In particular, "stiction" forces created between moving parts that come into contact with one another, either intentionally or accidentally, during operation are a common problem with micromechanical devices. Stiction-type failures occur when the interfacial attraction forces created between moving parts that come into contact with one another exceed restoring forces. As a result, the surfaces of these parts either permanently or temporarily adhere to each other, causing device failure or malfunction. Stiction forces are complex surface phenomena that generally include capillary forces, Van der Waal's forces and electrostatic attraction forces. As used herein, the term "contact" refers generally to any interaction between two surfaces and is not limited to the actual physical touching of the surfaces. Some examples of typical micromechanical devices are RF switches, optical modulators, microgears, accelerometers, worm gears, transducers, fluid nozzles, gyroscopes, and other similar devices or actuators. It should be noted that the term "MEMS device" is used hereafter to generally describe a micromechanical device, and to cover both MEMS and NEMS devices discussed above.

Stiction is especially problematic in devices such as the RF switch, optical modulator, microgears, and other actuators. Various elements in these devices often interact with each other during operation at frequencies between a few hertz (Hz) and a few gigahertz (GHz). Various analyses have shown that, without adding some form of lubrication to these types of devices to reduce stiction and wear between component surfaces, product lifetimes may range from only a few contacts to a few thousand contacts, which is generally well below a commercially viable lifetime. Consequently, one of the biggest challenges facing the MEMS and NEMS industries is the long-term reliability of contacting microstructures in the face of stiction.

Several techniques to address stiction between two contacting surfaces have been discussed in various publications. One such technique is to texture the contact surfaces (e.g., via micro patterning or laser patterning) to reduce the overall adhesion force by reducing the effective contact area. Another such technique involves selecting specific materials from which the contacting surfaces are made to lower the surface energy, reduce charging, or contact potential difference between components.

Moreover, some prior references have suggested the insertion of a lubricant into the region around the interacting devices to reduce the chance of stiction-related failures. Such a lubricant often times is in a solid or liquid state, depending on the properties of the material, and the temperature and pressure or environment in which the lubricant is placed. In general, the terms a "solid" lubricant or a "liquid" lubricant is a lubricant that is in a solid or liquid state under ambient conditions, i.e., room temperature and atmospheric pressure. Some prior art references describe a lubricant as being in a "vapor" state. These references use the term vapor phase lubricant to generally describe a mixture of components that contain a carrier gas (e.g., nitrogen) and a vaporized second component that is a solid or liquid at temperatures and pressures near ambient conditions (e.g., STP). In most conventional applications, the solid or liquid lubricant remains in a solid or liquid state at temperatures much higher than room temperature and pressures much lower than atmospheric pressure conditions.

Examples of typical lubricants that are solid or liquid at ambient conditions and temperatures well above ambient temperature can be found in references such as U.S. Pat. No. 6,930,367. Such prior art lubricants include dichlorodimethylsilane ("DDMS"), octadecyltrichlorosilane ("OTS"), perfluorooctyltrichlorsilane ("PFOTCS"), perfluorodecanoic acid ("PFDA"), perfluorodecyl-trichlorosilane ("FDTS"), perfluoro polyether ("PFPE") and/or fluoroalkylsilane ("FOTS"), that are deposited on various interacting components by use of a vapor deposition process, such as atmospheric chemical vapor deposition (APCVD), low pressure chemical vapor deposition (LPCVD), plasma enhanced chemical vapor deposition (PECVD), or other similar deposition processes.

The technique of forming the low-surface energy organic passivation layer on the surface of a MEMS component is commonly referred to in the art as "vapor lubricant" coating. One serious draw back to using a low-surface energy organic passivation layer, such as self-assembled monolayer (SAM) coatings, is that they typically are on the order of one monolayer thick. Generally, these types of coatings have a very limited usable lifetime, since they are easily damaged or displaced due to impact or wear created by the interaction of the various moving components. This inevitably happens in MEMS devices with contacting surfaces that are subject to frequent contact in use and a large number of contacts during the product lifetime, such as in light modulators and RF switches. Without some way to reliably restore or repair the damaged coatings, stiction occurs, and device failure results.

As shown in FIG. 1A, one approach for lubricating MEMS components is to provide a getter 110 within the package 100 (that includes a base 111, a lid 104, and a seal 106) in which an array of MEMS devices 108 resides. FIG. 1B illustrates one conventional package 120 that contains a MEMS device 108 and a getter 110 positioned within the head space 124 of the package 120. The package 120 also contains a package substrate 128, window 126 and spacer ring 125. These two configurations are further described in U.S. Pat. No. 6,843,936 and U.S. Pat. No. 6,979,893, respectively. These conventional devices employ some type of reversibly-absorbing getter to store the lubricant molecules in zeolite crystals or the internal volume of a micro-tube. In these designs, a supply of lubricant is maintained in the getter 110, and an amount of lubricant needed to lubricate the MEMS device 108 is discharged during normal operation. However, adding the reversibly absorbing getter, or reservoirs, to retain the liquid lubricants increases package size and packaging complexity and adds steps to the fabrication process, all of which increase piece-part cost as well as the overall manufacturing cost of MEMS or NEMS devices. Thus, forming a device that uses these techniques generally requires a number of labor-intensive and costly processing steps, such as mixing the getter material, applying the getter material to the device-containing package, curing the getter material, conditioning or activating the getter material, and then sealing the MEMS device and the getter within the sealed package.

Particles, moisture, and other contaminants found in our everyday atmospheric environment deleteriously effect device yield of a MEMS fabrication process and the average lifetime of a MEMS device. In an effort to prevent contamination during fabrication, the multiple process steps used to form a MEMS device are usually completed in an ultra-high grade clean room environment, e.g., class 10 or better. Due to the high cost required to produce and maintain a class 10 or better clean room environment, the more MEMS device fabrication steps that require such a clean room environment, the more expensive the MEMS device is to make. Therefore, there is a need to create a MEMS device fabrication process that reduces the number of processing steps that require an ultra-high grade clean room environment.

As noted above, in an effort to isolate the MEMS components from the everyday atmospheric environment, MEMS device manufacturers typically enclose the MEMS device within a device package so that a sealed environment is formed around the MEMS device. Conventional device packaging processes commonly require the lubricating materials that are contained within the MEMS device package be exposed to high temperatures during the MEMS device package sealing processes, particularly wafer level hermetic packaging. Typically, conventional sealing processes, such as glass frit bonding or eutectic bonding, require that the MEMS device, lubricants, and other device components are heated to temperatures between about 250° C. to 450° C. These high-bonding temperatures severely limit the type of lubricants that can be used in a device package and also cause the lubricant to evaporate away or break down after a prolonged period of exposure. In addition, lubricant that has evaporated during high temperature bonding processes can later re-condense onto and contaminate sealing surfaces. Therefore, there is also a need for a MEMS device package-fabricating process that eliminates or minimizes the exposure of lubricants to high temperatures during the device fabrication process.

SUMMARY OF THE INVENTION

The present invention generally relates to a micromechanical device that has an improved usable lifetime due to the presence of one or more channels that contain and deliver a lubricant that can reduce the likelihood of stiction occurring between the various moving parts of the device.

A device assembly according to an embodiment of the invention includes a micromechanical device enclosed within a processing region and a lubricant channel formed through at least one interior wall of the processing region to be in fluid communication with the processing region, wherein a substantial length of the lubricant channel extends into said at least one interior wall to be completely enclosed thereby. The volume of the lubricant channel may be between 0.1 nanoliter and 1000 nanoliters. The hydraulic diameter of the lubricant channel may be less than about 1 mm, and a length of the lubricant channel is substantially larger than a hydraulic diameter of the lubricant channel.

A device assembly according to another embodiment of the invention comprises a micromechanical device enclosed within a processing region and a lubricant channel formed on at least one interior wall of the processing region, wherein the lubricant channel is in fluid communication with the processing region along the entire length thereof, and the lubricant channel is configured so that a lubricant for the micromechanical device is held within the lubricant channel via surface tension of the lubricant against internal surfaces of the lubrication channel.

Embodiments of the invention also provide a packaged micromechanical device that includes a lid, a base, and an interposer that define a processing region for a micromechanical device, a micromechanical device disposed within the processing region, and a lubricant channel formed through at least one interior wall of the processing region and in fluid communication with the processing region, wherein the lubricant channel is configured so that a lubricant for the micromechanical device is held within the lubricant channel via surface tension of the lubricant against internal surfaces of the lubrication channel. An epoxy layer may be interposed between the lid and the interposer and between the interposer and the base.

Typically, a channel inlet that is in fluid communication with the lubrication channel is formed through an exterior wall of the micromechanical device assembly or package. Lubricant is injected into the lubrication channel through this channel inlet. However, when an epoxy layer is used, the lubricant may be injected into the lubricant channel prior to the sealing of the package and the channel inlet becomes no longer necessary.

One advantage of the invention is that a reservoir of a lubricating material is formed within a device package so that an amount of "fresh" lubricating material can be delivered to areas where stiction may occur. In one aspect, the lubricating material is contained in one or more microchannels that are adapted to evenly deliver a mobile lubricant to interacting areas of the MEMS device. In another aspect, different lubricant materials can be brought into the device in a sequential manner via one channel, or contained concurrently in separate channels. Consequently, the lubricant delivery techniques described herein more reliably and cost effectively prevent stiction-related device failures relative to conventional lubricant delivery schemes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1A:
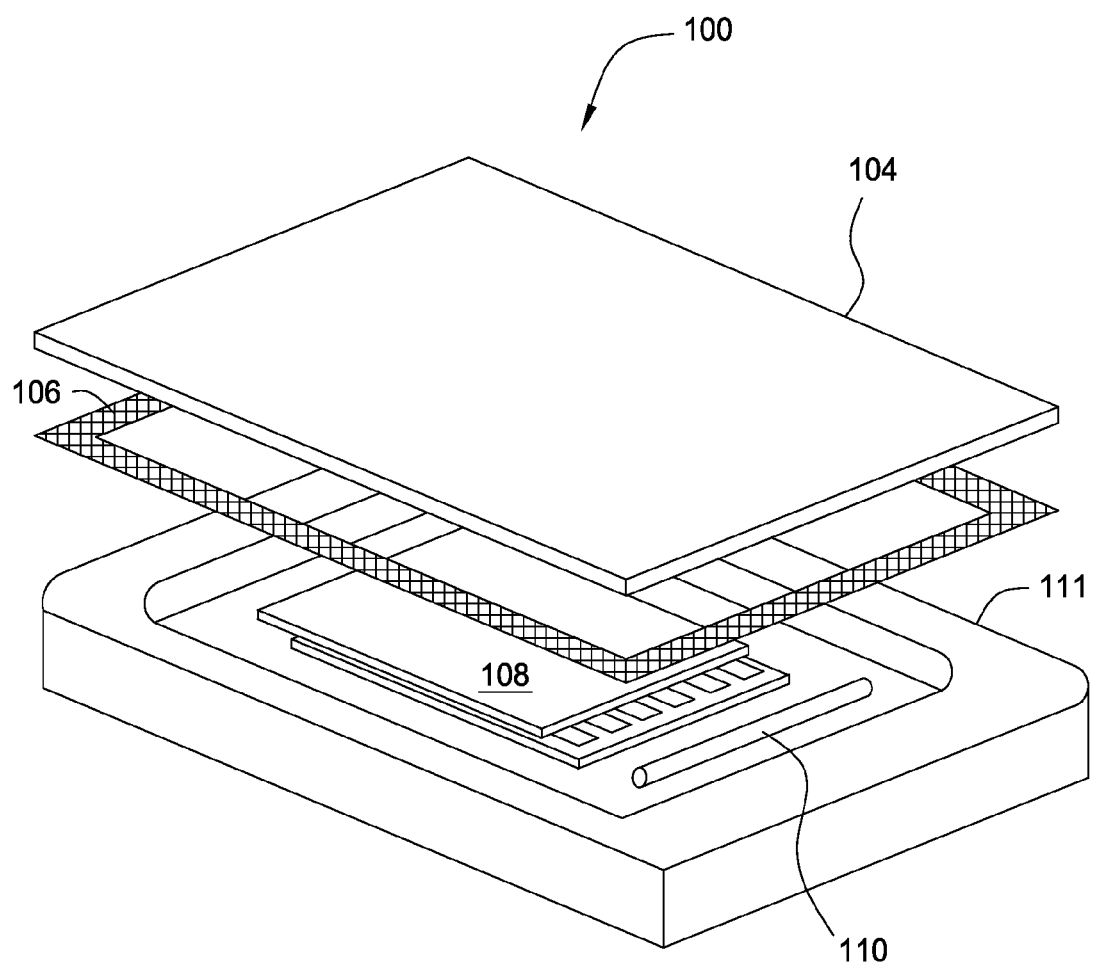
FIG. 1A schematically illustrates a cross-sectional view of a prior art device package containing a getter.
Figure 1B:
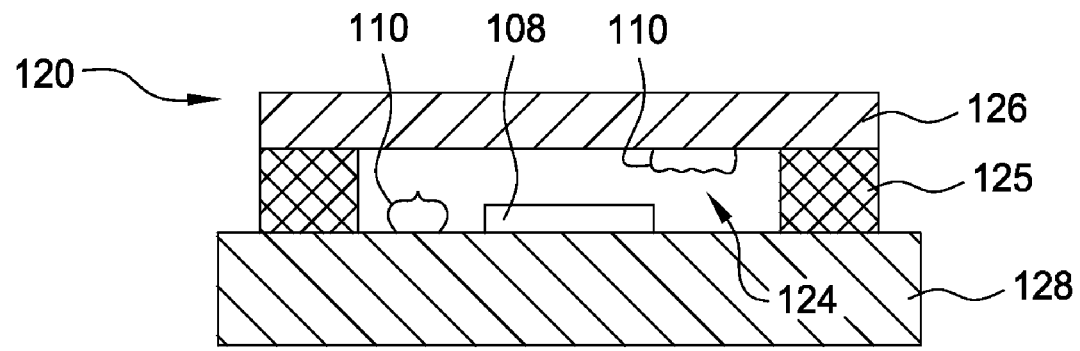
FIG. 1B schematically illustrates a cross-sectional view of another prior art device package containing a getter.

The present invention generally relates to a micromechanical device that has an improved usable lifetime due to the presence of one or more channels that contain and deliver a lubricant that can reduce the likelihood of stiction occurring between the various moving parts of the device.

Embodiments of the present invention include an enclosed device package, and a method of forming the same, where the enclosed device package has one or more lubricant-containing channels for delivering lubricant to a MEMS device disposed within the enclosed region of the device package. The one or more lubricant-containing channels act as a ready supply of fresh lubricant to prevent stiction between interacting components of the device disposed within the enclosed region of the device package. This supply of fresh lubricant may also be used to replenish damaged lubricants (worn-off, broken down, etc.) between various contacting surfaces. In one example, aspects of this invention may be especially useful for fabricating micromechanical devices, such as MEMS devices, NEMS devices, or other similar thermal or fluidic devices.

In one embodiment, the amount and type of lubricant disposed within the channel is selected so that fresh lubricant can readily diffuse or be transported in a gas or vapor phase to all areas of the processing region to reduce the chances of stiction-related failure. In another embodiment, the lubricant and the surfaces of walls of the processing region, in particular the wettability of the surfaces, are selected so that fresh lubricant is transported in a liquid phase onto surfaces of walls of the processing region via capillary forces, and subsequently released to the internal region of the device as molecules or molecular vapor.

One of skill in the art recognizes that the term lubricant, as used herein, is intended to describe a material adapted to provide lubrication, anti-stiction, and/or anti-wear properties to contact surfaces. In addition, the term lubricant, as used herein, is generally intended to describe a lubricant that is in a liquid, vapor and/or gaseous state during the operation and storage of a MEMS device.

Aspects of the present invention take advantage of characteristics of the microfluidics. In particular, microchannels or lubricant channels are configured in view of the lubricant material to be used so that capillary forces can be used to manipulate liquid lubricants into one or more lubricant channels that are in fluid communication with a process region of a MEMS device. The lubricant channel has at least two types of applications. The first application is to serve as a storage for the lubricants for lifetime use of the MEMS device. The second application is to provide a controllable way to deliver lubricants into the process region in a well-controller manner. In certain cases, simple external mechanical pressure from a pipette or a pump, for example, may be used alone, or in conjunction with the capillary forces to manipulate liquid lubricants into the lubricant channels.

Overview of Exemplary System

Figure 2A:
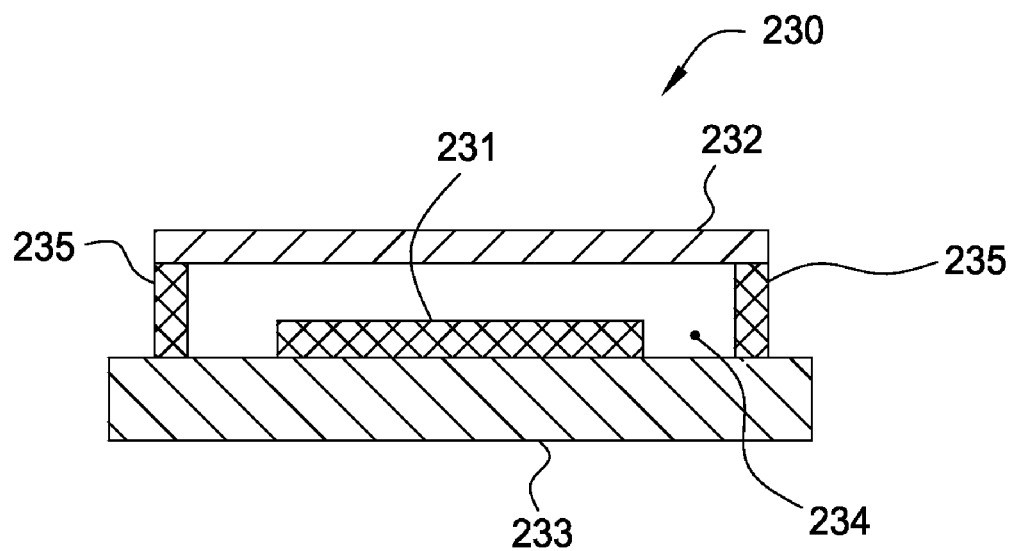
FIG. 2A illustrates a cross-sectional view of a device package assembly, according to one embodiment of the invention.

In an effort to prevent contamination from affecting the longevity of MEMS or NEMS components, these devices are typically enclosed within an environment that is isolated from external contamination, such as particles, moisture, or other foreign material. FIG. 2A illustrates a cross-sectional view of a typical MEMS device package 230 that contains a MEMS device 231 enclosed within a processing region 234 formed between a lid 232, interposer 235 and a base 233. Typically, the lid 232, interposer 235 and base 233 are all hermetically or non-hermetically sealed so that the components within the processing region 234 are isolated from external contamination that may interfere with the use of the device.

Figure 2B:
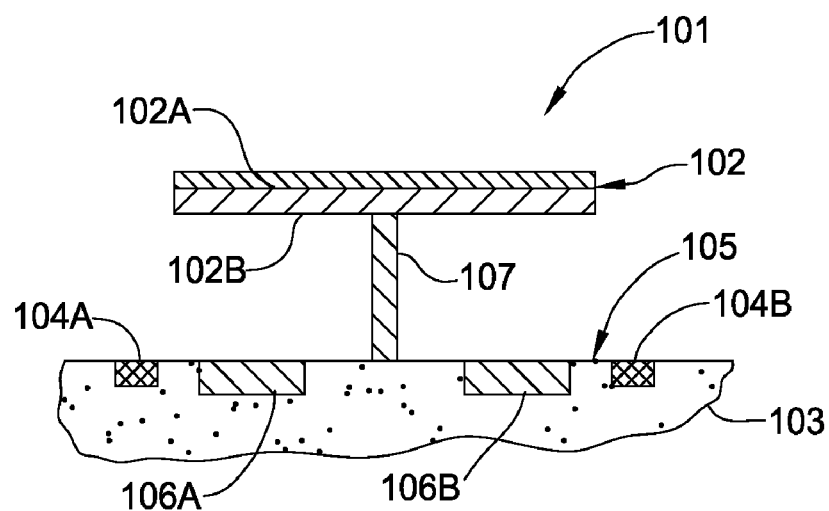
FIG. 2B schematically illustrates a cross-sectional view of a single mirror assembly, according to one embodiment of the invention.

FIG. 2B illustrates a representative micromechanical device that may be formed within the MEMS device 231 of FIG. 2A, which is used herein to describe various embodiments of the invention. The device shown in FIG. 2B schematically illustrates a cross-sectional view of a single mirror assembly 101 contained in a spatial light modulator (SLM). One should note that the MEMS device shown in FIG. 2B is not intended in any way to limit the scope of the invention described herein, since one skilled in the art would appreciate that the various embodiments described herein could be used in other MEMS, NEMS, larger scale actuators or sensors, or other comparable devices that experience stiction or other similar problems. While the discussion below specifically discusses the application of one or more of the various embodiments of the invention using a MEMS or NEMS type of device, these configurations also are not intended to be limiting as to the scope of the invention.

In general, a single mirror assembly 101 may contain a mirror 102, base 103, and a flexible member 107 that connects the mirror 102 to the base 103. The base 103 is generally provided with at least one electrode (elements 106A or 106B) formed on a surface 105 of the base 103. The base 103 can be made of any suitable material that is generally mechanically stable and can be formed using typical semiconductor processing techniques. In one aspect, the base 103 is formed from a semiconductor material, such as a silicon-containing material, and is processed according to standard semiconductor processing techniques. Other materials may be used in alternative embodiments of the invention. The electrodes 106A, 106B can be made of any materials that conduct electricity. In one aspect, the electrodes 106A, 106B are made of a metal (e.g., aluminum, titanium) deposited on the surface 105 of the base 103 and etched to yield desired shape. A MEMS device of this type is described in the commonly assigned U.S. patent application Ser. No. 10/901,706, filed Jul. 28, 2004.

The mirror 102 generally contains a reflective surface 102A and a mirror base 102B. The reflective surface 102A is generally formed by depositing a metal layer, such as aluminum or other suitable material, on the mirror base 102B. The mirror 102 is attached to the base 103 by a flexible member 107. In one aspect, the flexible member 107 is a cantilever spring that is adapted to bend in response to an applied force and to subsequently return to its original shape after removal of the applied force. In one embodiment, the base 103 is fabricated from a first single piece of material, and the flexible member 107 and the mirror base 102B are fabricated from a second single piece of material, such as single crystal silicon. Importantly, the use of any device configuration that allows the surface of one component (e.g., mirror 102) to contact the surface of another component (e.g., base 103) during device operation, thereby leading to stiction-related problems, generally falls within the scope of the invention. For example, a simple cantilever beam that pivots about a hinge in response to an applied force such that one end of the cantilever beam contacts another surface of the device is within the scope of the invention.

In one aspect, one or more optional landing pads (elements 104A and 104B in FIG. 2B) are formed on the surface 105 of the base 103. The landing pads are formed, for example, by depositing a metal layer containing aluminum, titanium nitride, tungsten or other suitable materials. In other configurations, the landing pads may be made of silicon (Si), polysilicon (poly-Si), silicon nitride (SiN), silicon carbide (SiC), diamond like carbon (DLC), copper (Cu), titanium (Ti) and/or other suitable materials.

Figure 2C:
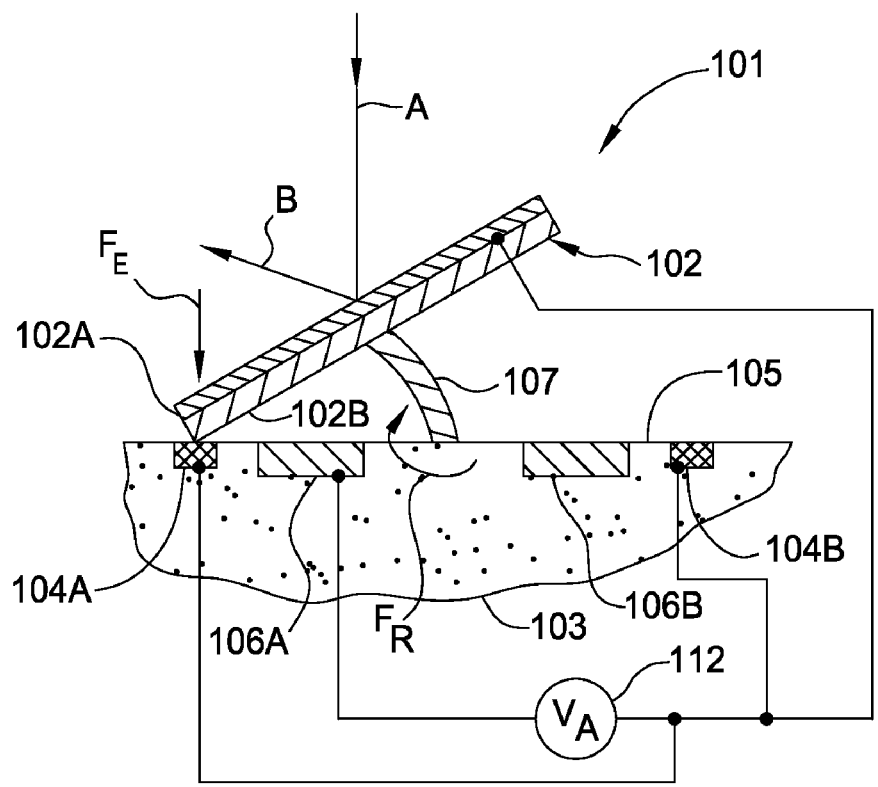
FIG. 2C schematically illustrates a cross-sectional view of a single mirror assembly in a deflected state, according to one embodiment of the invention.

FIG. 2C illustrates the single mirror assembly 101 in a distorted state due to the application of an electrostatic force $F_E$ created by applying a voltage $V_A$ between the mirror 102 and the electrode 106A using a power supply 112. As shown in FIG. 2C, it is often desirable to bias a landing pad (e.g., elements 104A) to the same potential as the mirror 102 to eliminate electrical breakdown and electrical static charging in the contacting area relative to mirror 102. During typical operation, the single mirror assembly 101 is actuated such that the mirror 102 contacts the landing pad 104A to ensure that a desired angle is achieved between the mirror 102 and the base 103 so that incoming optical radiation "A" is reflected off the surface of the mirror 102 in a desired direction "B." The deflection of the mirror 102 towards the electrode 106A due to the application of voltage $V_A$ creates a restoring force (e.g., moment), due to the bending of the flexible member 107. The magnitude of the restoring force is generally defined by the physical dimensions and material properties of the flexible member 107, and the magnitude of distortion experienced by the flexible member 107. The maximum restoring force is typically limited by the torque applied by the electrostatic force $F_E$ that can be generated by the application of the maximum allowable voltage $V_A$. To assure contact between the mirror 102 and the landing pad 104A the electrostatic force $F_E$ must be greater than the maximum restoring force.

As the distance between the mirror 102 and the landing pad 104A decreases, the interaction between the surfaces of these components generally creates one or more stiction forces that acts on the mirror 102. When the stiction forces equal or exceed the restoring force, device failure results, since the mirror 102 is prevented from moving to a different position when the electrostatic force generated by voltage $V_A$ is removed or reduced.

As previously described herein, stiction forces are complex surface phenomena that generally include three major components. The first is the so-called "capillary force" that is created at the interface between a liquid and a solid due to an intermolecular force imbalance at the surface of a liquid (e.g., Laplace pressure differences) that generates an adhesive-type attractive force. Capillary force interaction in MEMS and NEMS devices usually occurs when a thin layer of liquid is trapped between the surfaces of two contacting components. A typical example is the water vapor in the ambient. The second major component of stiction forces is the Van der Waal's force, which is a basic quantum mechanical intermolecular force that results when atoms or molecules come very close to one another. When device components contact one another, Van der Waal's forces arise from the polarization induced in the atoms of one component by the presence of the atoms of the second component. When working with very planar structures, such as those in MEMS and NEMS devices, these types of stiction forces can be significant due to the size of the effective contact area. The third major component of stiction forces is the electrostatic force created by the coulombic attraction between trapped charges found in the interacting components.

Device Package Configurations

Figure 3A:
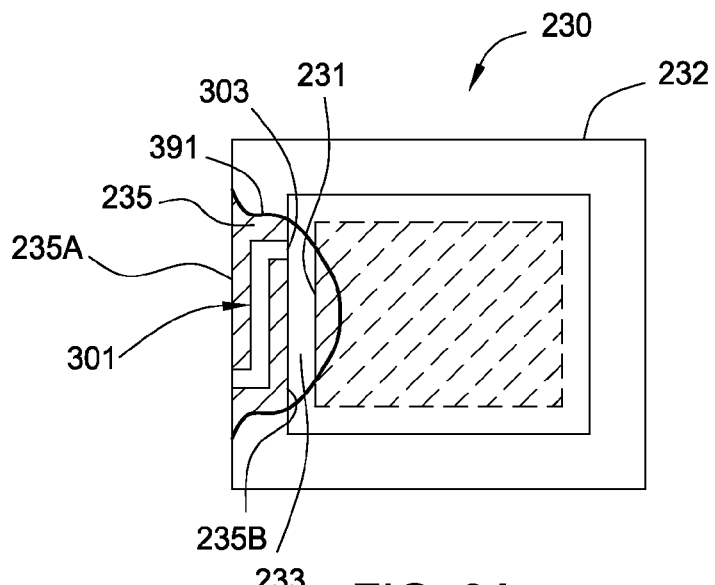
FIG. 3A illustrates a cross-sectional plan view of a device package assembly, according to one embodiment of the invention.

FIG. 3A is a plan view of the MEMS device package 230 illustrated in FIG. 2A having a microfluidic channel or lubricant channel 301 formed in the MEMS device package 230. For clarity, MEMS device package 230 is illustrated with a partial section 391 of lid 232 removed. The lubricant channel 301 is a microchannel, i.e., a conduit with a hydraulic diameter of a few micrometers to less than about 1 mm, and may be formed in any one of the walls that enclose the processing region 234. In one embodiment, as shown in FIG. 3A, the lubricant channel 301 is formed in the interposer 235 just below the lid 232. Alternatively, lubricant channel 301 may be formed in the lid 232 or in the base 233 of MEMS device package 230.

Figure 3B:
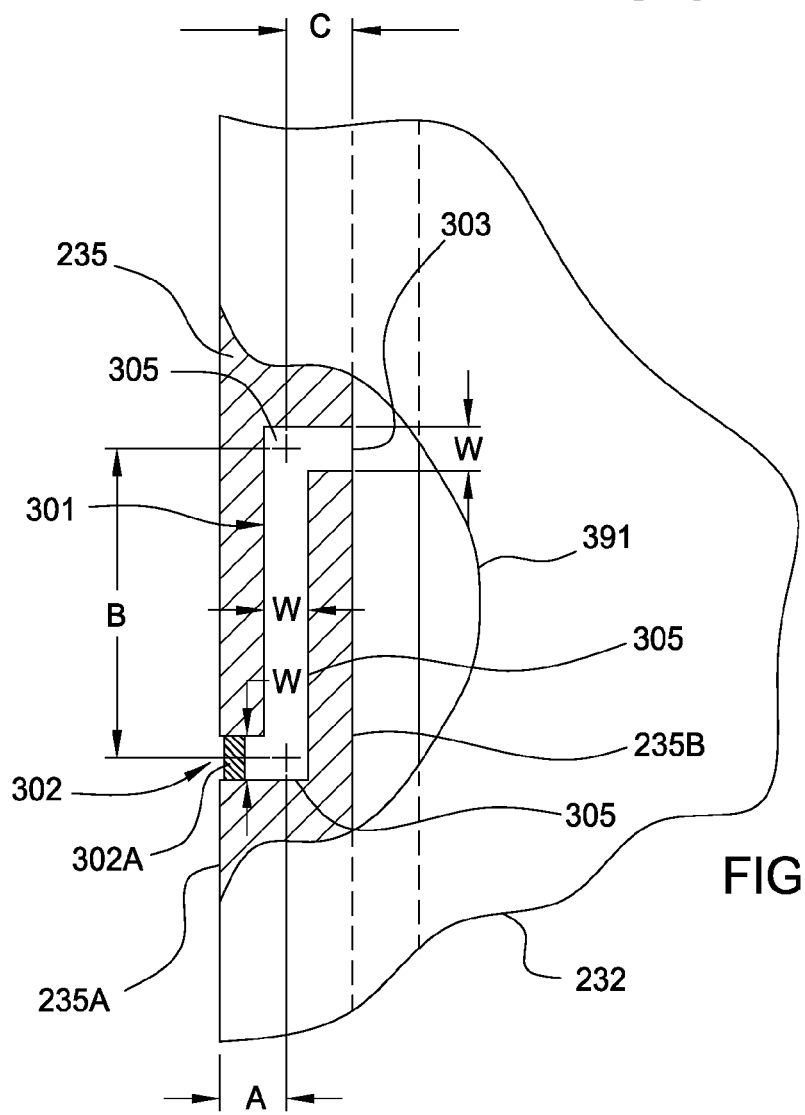
FIGS. 3B and 3C illustrate close-up views of a partial section and a lubricant channel in FIG. 3A, according to one embodiment of the invention.

In one embodiment, the lubricant channel 301 extends from an interior surface 235B of one of the walls that encloses the processing region 234 to a channel inlet 302 (see FIG. 3B). The channel inlet 302 penetrates an exterior surface 235A to allow the introduction of one or more lubricants into the lubricant channel 301. In alternative embodiments, the lubricant channel 301 does not extend to an exterior surface (see FIG. 5L) and may be formed on one of the walls that enclose the processing region 234 (see FIG. 3G).

To prevent ingress of particles, moisture, and other contamination into the processing region 234 and lubricant channel 301 from the outside environment, lubricant channel 301 is configured so that it is sealed from the outside environment. In one embodiment, channel inlet 302 is sealed with a closure 302A after a lubricant (not shown for clarity) is introduced into lubricant channel 301, as illustrated in FIG. 3B. Methods for forming closure 302A to seal channel inlet 302 according to this embodiment are described below in conjunction with FIGS. 6F and 6G.

Figure 3C:
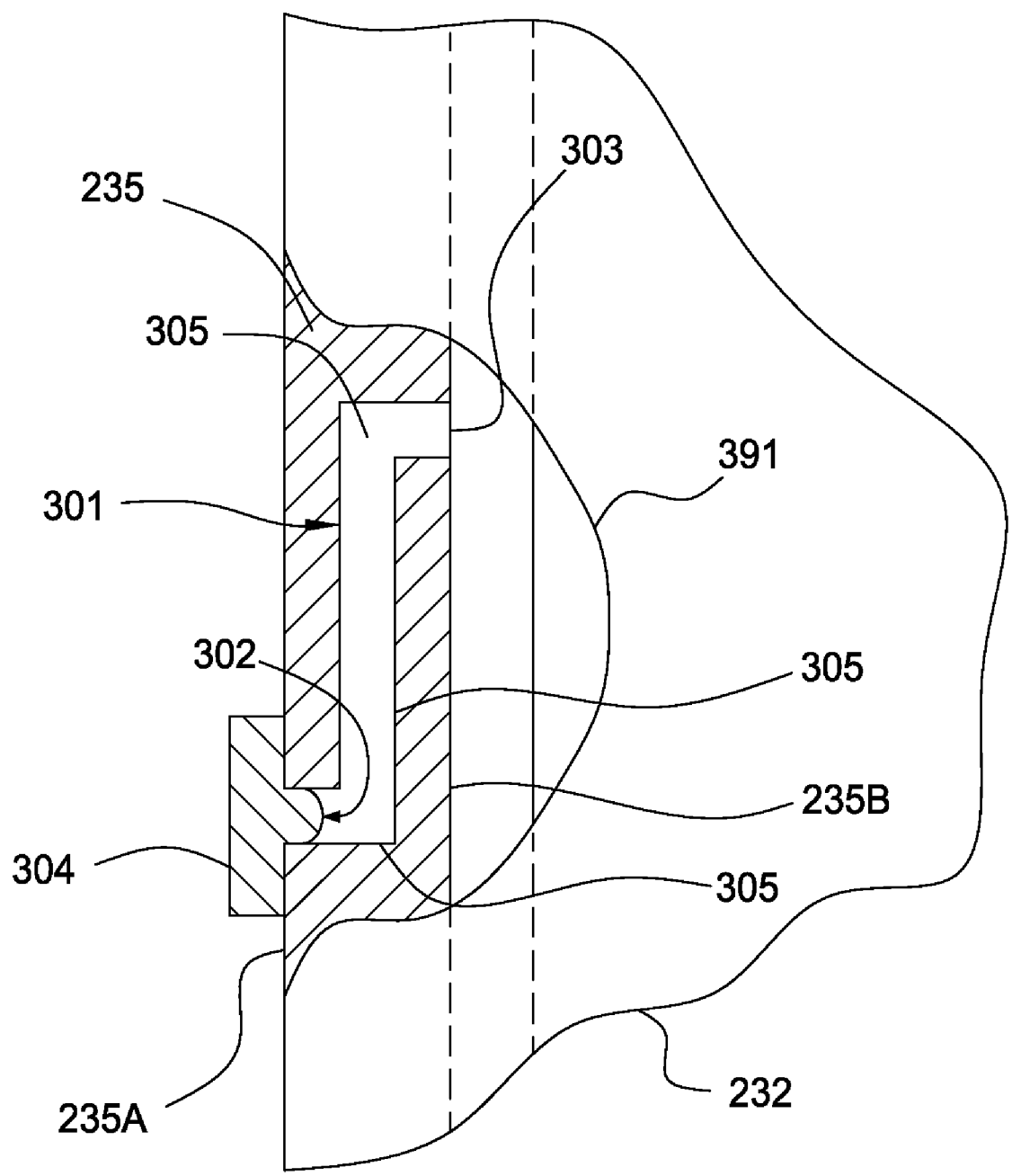

In another embodiment, a cap 304 is positioned over the channel inlet 302 after lubricant channel 301 is filled with lubricant, as shown in FIG. 3C. The cap 304 may be a polymer, such as epoxy or silicone, or other solid material that is bonded to the exterior surface 235A using conventional sealing techniques. In one aspect, cap 304 is a plug of material that is positioned inside the channel inlet 302 after lubricant channel 301 is filled with lubricant. The plug of material sealing channel inlet 302 may be an indium metal plug, which may be applied as a molten solder droplet to channel inlet 302 without the use of flux, a potential contaminant. This is because indium alloys with silicon and therefore wets exterior surface 235A and channel inlet 302. The plug of material sealing channel inlet 302 may also include a hydrophobic, high-vacuum grease, such as Krytox®.

The lubricant channel 301 is adapted to contain a desired amount of a lubricant (not shown) that vaporizes or diffuses into the processing region 234 over time. The rate at which the lubricant migrates into the processing region is affected by a number of factors, including the geometry of the lubricant channel 301, lubricant molecular weight, bond strength of the lubricant to processing region surfaces (e.g., via physisorption, chemisorption), capillary force created by the surface tension of the lubricant against internal surfaces of the lubrication channel 301, lubricant temperature, and pressure of the volume contained within the processing region 234.

In one embodiment, lubricant channel 301 is adapted to contain a volume of lubricant between about 0.1 nanoliters (nl) and about 1000 nl. Referring to FIG. 3B, the volume of the lubricant channel 301 is defined by the formed length times the cross-sectional area of the lubricant channel 301. The length of the lubricant channel 301 is the channel length extending from the exterior surface 235A to the interior surface 235B, i.e., the sum of the length of segments A, B and C, as shown in FIG. 3B. The channel length is between 10 micrometers to 1 mm. In one aspect, the cross-section of lubricant channel 301 is rectangular and the cross-sectional area (not shown) is defined by the depth (not shown) and the width W of the lubricant channel 301. In one embodiment, the width W of the lubricant channel 301 is between about 10 micrometers ($\mu$m) and about 800 $\mu$m and the depth is between about 10 micrometers ($\mu$m) and about 200 $\mu$m. The cross-section of the lubricant channel 301 need not be square or rectangular, and can be any desirable shape without varying from the basic scope of the invention.

Figure 3D:
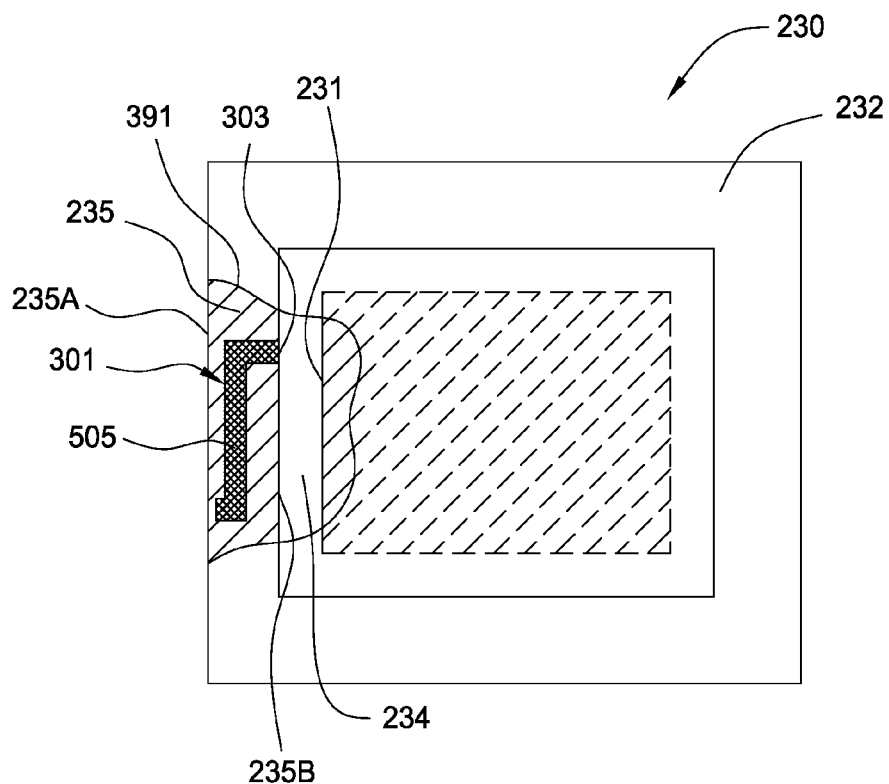
FIG. 3D illustrates a lubricant channel that has a volume of lubricant disposed therein to provide a ready supply of lubricant to a processing region, according to one embodiment of the invention.

FIG. 3D illustrates a lubricant channel 301 that has a volume of lubricant 505 disposed therein to provide a ready supply of lubricant to the processing region 234. During normal operation of the MEMS device 231, molecules of the lubricant tend to migrate to all areas within the processing region 234. The continual migration of the lubricant 505 to the areas of the MEMS device 231 where stiction may occur is useful to prevent stiction-related failures at contact regions between two interacting MEMS components. As lubricant molecules breakdown at the contact regions and/or adsorb onto other surfaces within the processing region 234 during operation of the MEMS device 231, fresh lubricant molecules from lubricant channel 301 replace the broken-down or adsorbed lubricant molecules, thereby allowing the lubricant 505 in the lubricant channel 301 to act as a lubricant reservoir.

The movement or migration of molecules of the lubricant 505 is generally performed by two transport mechanisms. The first mechanism is a surface diffusion mechanism, where the lubricant molecules diffuse across the internal surfaces of processing region 234 to reach the contact region between two interacting MEMS components. In one aspect, the lubricant 505 is selected for good diffusivity over the surfaces contained within the processing region 234. The second mechanism is a vapor phase, or gas phase, migration of the lubricant 505 stored in lubricant channel 301 to the contact region between two interacting MEMS components. In one aspect, the lubricant 505 stored in the lubricant channels 301 of the device package is selected so that molecules of lubricant 505 desorb from these areas and enter into the process region 234 as a vapor or gas. During operation of the device, the lubricant molecules reach an equilibrium partial pressure within processing region 234 and then, in a vapor or gaseous state, migrate to an area between the interacting surfaces of process region 234 and MEMS device 231.

Since these two types of transport mechanisms aid in the build-up of a lubricant layer, thereby reducing the interaction of moving MEMS components, the act of delivering lubricant to an exposed region of the MEMS device is generally referred to hereafter as "replenishment" of the lubricant layer, and a lubricant delivered by either transport mechanism is referred to as a "mobile lubricant." Generally, a sufficient amount of replenishing lubricant molecules are stored inside the lubricant channel 301 so that the sufficient lubricant molecules are available to prevent stiction-induced failures at the interacting areas of the MEMS device during the entire life cycle of the product.

Figure 3E:
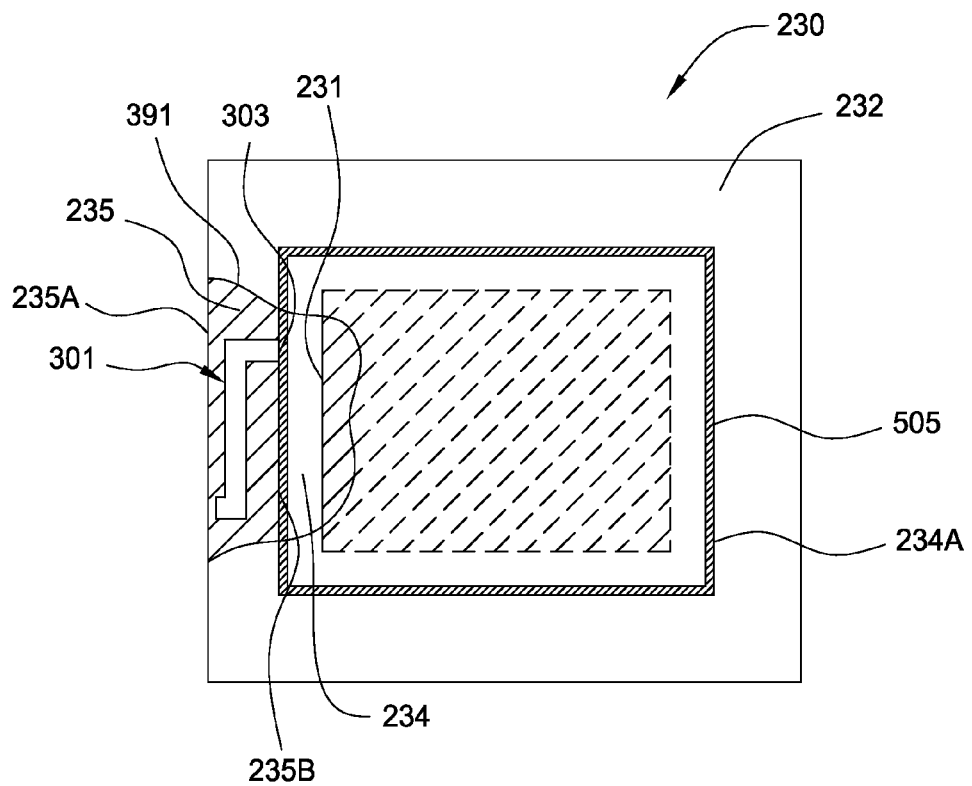
FIG. 3E illustrates a cross-sectional plan view of a device package assembly, according to one embodiment of the invention.

In one embodiment, illustrated in FIG. 3E, the size of the lubricant channel 301 is selected and the internal surface 234A is selectively treated, so that the surface tension of a liquid lubricant 505 against the surfaces of the lubricant channel 301 and the internal surface 234A causes the lubricant 505 to be drawn from a position outside of the MEMS device package 230 into lubricant channel 301 and then into the processing region 234. In this way, the lubricant channel 301 acts as a liquid injection system that allows the user to deliver an amount of the lubricant 505 into the processing region 234, by use of capillary forces created when the lubricant 505 contacts the walls of the lubricant channel 301. In one example, the cross-section of lubricant channel 301 is rectangular, and the width of the lubricant channel 301 is between about 100 micrometers (μm) and about 600 μm, and the depth is between about 100 μm±50 μm. When in use, capillary forces can deliver an amount of lubricant 505 to the processing region 234 that is smaller or larger than the volume of the lubricant channel 301. In this configuration it may be possible to sequentially deliver different volumes of two or more different lubricants through the same lubricant channel 301. Alternatively, a first lubricant may be transmitted through the lubricant channel 301 and then a second lubricant is retained in the lubricant channel 301 in a subsequent step.

In another embodiment, the lubricant 505 is selected so that a portion of the lubricant 505 vaporizes to form a vapor or gas within the processing region during normal operation of the device. In cases where the MEMS device is a spatial light modulator (SLM), typical device operating temperatures may be in a range between about 0° C. and about 70° C. The ability of the lubricant to form a vapor or gas is dependent on lubricant equilibrium partial pressure, which varies as a function of the temperature of the lubricant, the pressure of the region surrounding the lubricant, lubricant bond strength to internal surfaces of the processing region 234, and lubricant molecular weight.

Figure 3F:
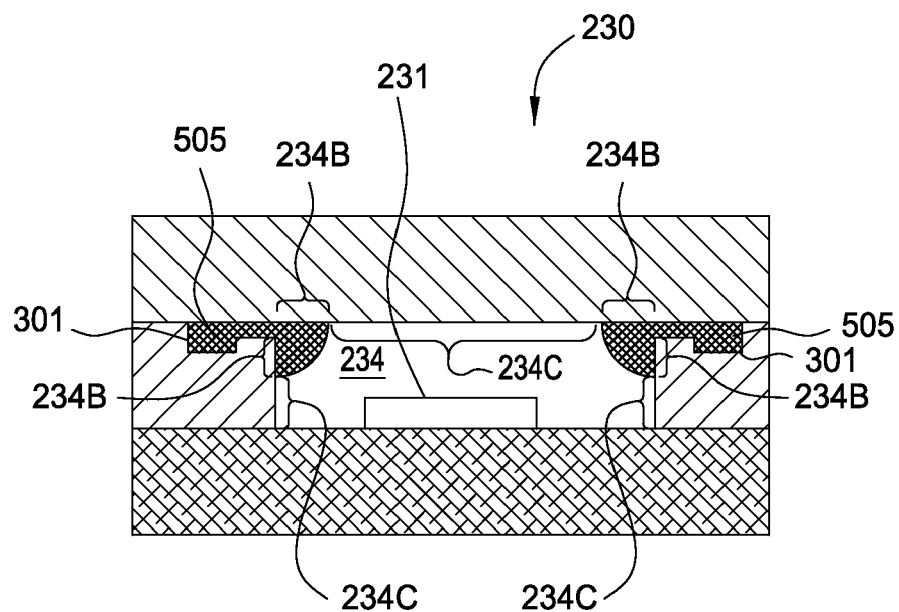
FIG. 3F illustrates a cross-sectional plan view of a device package assembly having channels inside the processing region of the device package assembly, according to one embodiment of the invention.
Figure 3G:
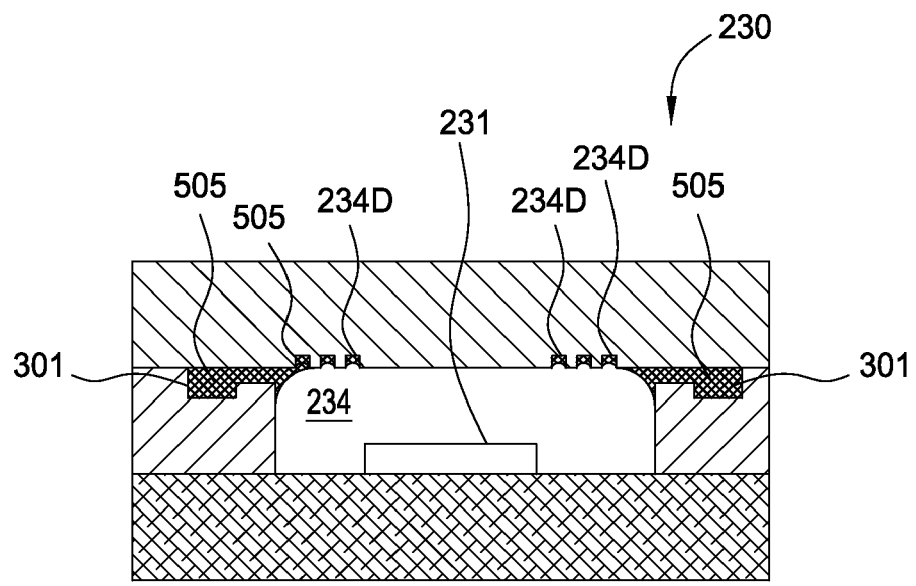
FIG. 3G illustrates a cross-sectional plan view of a device package assembly having lubricant-containing channels on an interior wall of the processing region, according to one embodiment of the invention.

In another embodiment, the lubricant 505 is selected due to its ability to rapidly diffuse along the surfaces within the processing region 234. In this embodiment, internal surfaces 234B of the processing region 234 and/or the lubricant channel 301 may be treated to act as wetting surfaces for the lubricant 505, as illustrated in FIG. 3F. In this way, the lubricant 505 is brought into processing region 234 in a liquid form to act as a reservoir of mobile lubricant for MEMS device package 230 throughout the MEMS device lifetime. To prevent interference with contact surfaces within the processing region 234, selected areas of internal surfaces 234C of processing region 234 may be treated to act as non-wetting surfaces for the lubricant 505. In this way, a liquid reservoir of mobile lubricant is formed in processing region 234 with no danger of interfering with components of MEMS device 231. In one aspect, channels or grooves 234D are formed in one or more internal surfaces of the processing region 234 to better retain lubricant 505, as shown in FIG. 3G.

In another embodiment, the lubricant 505 is adapted to operate at a temperature that is within an extended operating temperature range, which is between about 0° C. and about 70° C. In yet another embodiment, the lubricant is selected so that it will not decompose when the device is exposed to temperatures that may be experienced during a typical MEMS or NEMS packaging process, i.e., between about −30° C. and about 400° C.

Examples of lubricants 505 that may be disposed within a lubricant channel 301 and used to prevent stiction of the interacting components within a MEMS device are perfluorinated polyethers (PFPE), self assembled monolayer (SAM) or other liquid lubricants. Some known types of PFPE lubricants are Y or Z type lubricants (e.g., Fomblin® Z25) available from Solvay Solexis, Inc. of Thorofare, N.J., Krytoxe from DuPont, and Demnum® from Daikin Industries, LTD. Examples of SAM include dichlorodimethylsilane ("DDMS"), octadecyltrichlorosilane ("OTS"), perfluoroctyl-trichlorsilane ("PFOTCS"), perfluorodecyl-trichlorosilane ("FDTS"), fluoroalkylsilane ("FOTS").

In alternative embodiments, it may be desirable to modify the properties of the surfaces within the lubricant channel 301 to change the lubricant bond strength to surfaces with the internal region 305, shown in FIG. 3B, of the lubricant channel 301. For example, it may be desirable to coat the surfaces of the lubricant channel 301 with an organic passivating material, such as a self-assembled-monolayer (SAM). Useful SAM materials include, but are not limited to, organosilane type compounds such as octadecyltrichlorosilane (OTS), perfluorodecyltrichlorosilane (FDTS). The surfaces of the lubricant channel 301 may also be modified by exposing them to microwaves, UV light, thermal energy, or other forms of electromagnetic radiation to alter the properties of the surface of the lubricant channel 301.

As noted above, conventional techniques that require the addition of a reversibly absorbing getter to MEMS device package to retain a lubricant substantially increase the device package size and the complexity of forming the device, and also add steps to the fabrication process. Such device package designs have an increased piece-part cost and an increased overall manufacturing cost, due to the addition of extra getter components. Therefore, by disposing a mobile lubricant in a lubricant channel formed in or on one or more of the walls enclosing the processing region, an inexpensive and reliable MEMS device can be formed. The use of the lubricant channel 301 eliminates the need for a reversibly adsorbing getter and thus reduces the device package size, the manufacturing cost, and the piece-part cost. The embodiments described herein also improve device reliability by reducing the likelihood that during operation additional components positioned within the processing region, such as getter materials, contact the moving or interacting MEMS components within the device package.

Lubricant Channel Formation Process

According to embodiments of the invention, a lubricant channel similar to lubricant channel 301 of MEMS device package 230 can be formed in one or more of the walls of an enclosure containing a MEMS or any other stiction-sensitive device. Typically, MEMS devices are enclosed in a MEMS device package 230, as illustrated above in FIG. 2A, using a chip-level or wafer-level packaging process. An example of a chip-level packaging process can be found in U.S. Pat. No. 5,936,758 and U.S. Patent Publication No. 20050212067. The process sequence discussed below can also be applied to wafer-level hermetic packaging, in which a plurality of MEMS devices are packaged simultaneously by aligning and assembling a number of silicon and glass wafers into a stack. For example, a plurality of MEMS device packages substantially similar to MEMS device 230 may be formed via wafer-level hermetic packaging by using a base 233 from which the MEMS device packages 230 will be formed. A plurality of MEMS devices 231 may be formed on the base 233 or individually bonded to the base 233. The sealed MEMS devices 230 can be formed by bonding the base 233, an interposer wafer, and a glass wafer. The individual MEMS device packages are then formed by singulating the bonded wafer stack by dicing, laser cutting or other methods of die separation. The remaining packaging assembly and testing processes following wafer-level hermetic packaging and die singulation do not require an ultra-high clean room environment and hence reduce the overall packaging cost to manufacture a device. In addition, embodiments of the invention described below have a particular advantage over conventional MEMS device packaging processes, since they eliminate the requirement that the MEMS device lubricant be exposed to a high temperature during the steps used to form the sealed processing region 234.

While the discussion below focuses on a wafer-level packaging method, the techniques and general process sequence need not be limited to this type of manufacturing process. Therefore, the embodiments of the invention described herein are not intended to limit the scope of the present invention. Examples of MEMS device packages and processes of forming the MEMS device packages that may benefit from one or more embodiments of the invention described herein are further described in the following commonly assigned U.S. patent application Ser. No. 10/693,323, filed Oct. 24, 2003, U.S. patent application Ser. No. 10/902,659, filed Jul. 28, 2004, and U.S. patent application Ser. No. 11/008,483, filed Dec. 8, 2004.

Figure 4A:
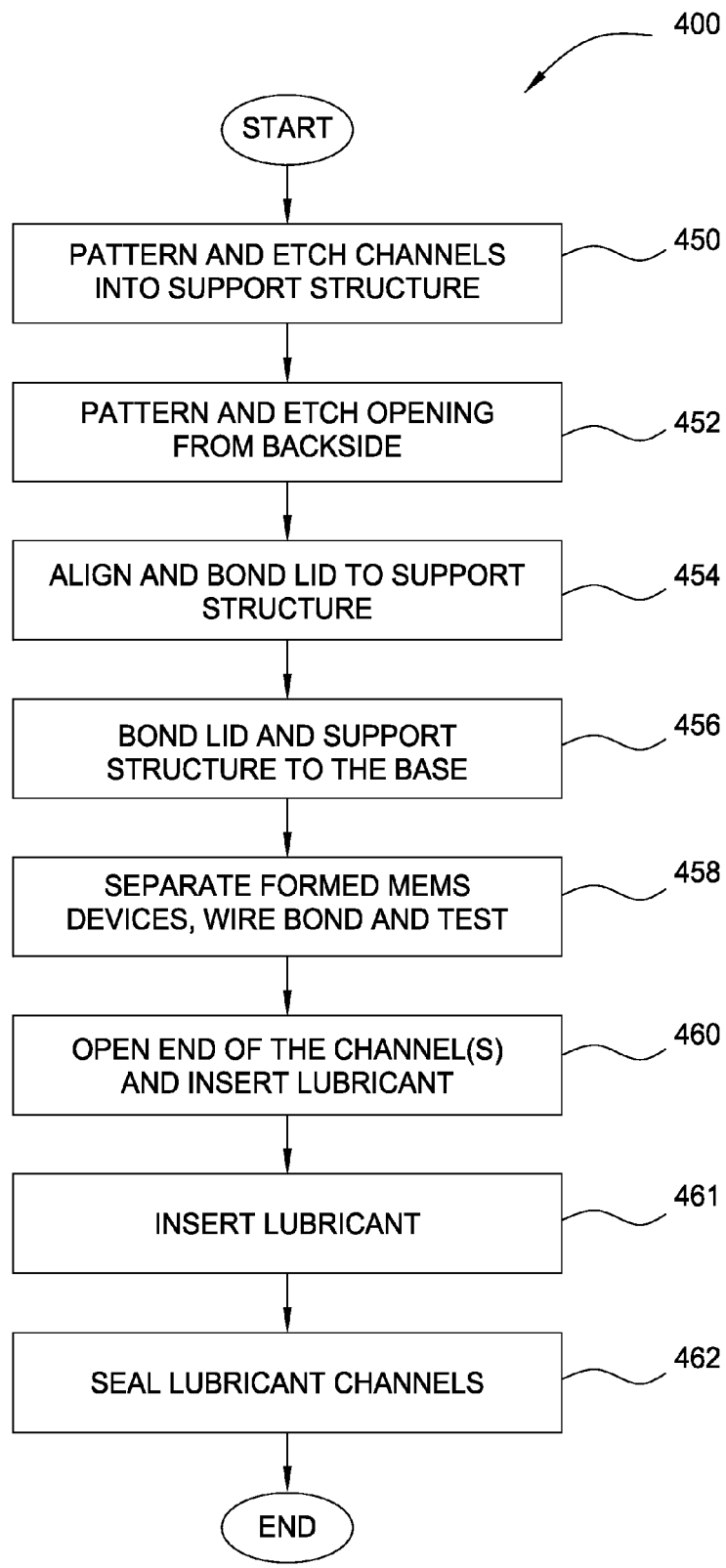
FIGS. 4A-C illustrate process sequences for forming a MEMS device package that includes lubrication channels, according to embodiments of the invention.

FIG. 4A illustrates a process sequence 400 for forming a MEMS device package 230 that includes lubrication channels 301, according to one embodiment of the invention. FIGS. 5A-5F illustrate the various states of one or more of the components of the MEMS device package 230 after each step of process sequence 400 has been performed. FIG. 5A is a cross-sectional view of a wafer 235C that may be used to form the multiple MEMS device packages 230, as shown in FIG. 5F. The wafer 235C may be formed from a material such as silicon (Si), a metal, a glass material, a plastic material, a polymer material, or other suitable material.

Referring now to FIGS. 4A and 5B, in step 450, conventional patterning, lithography and dry etch techniques are used to form the lubricant channels 301 and the optional depressions 401 on a top surface 404 of the wafer 235C. The depth D of the lubricant channels 301 and the depressions 401 are set by the time and etch rate of the conventional dry etching process performed on the wafer 235C. It should be noted that the lubricant channels 301 and depressions 401 may be formed by other conventional etching, ablation, or other manufacturing techniques without varying from the scope of the basic invention.

Referring now to FIGS. 4A and 5C, in step 452, conventional patterning, lithography and dry etch techniques are used to remove material from the back surface 405 through the base wall 403 of the depressions 401 to form a through hole 402 that defines the interior surface 235B. Interior surface 235B, together with the lid 232 and the base 233 (shown in FIGS. 5E-5F), defines processing region 234 of MEMS device package 230. The process of removing material from the wafer 235C to form the through hole 402 may also be performed by conventional etching, ablation, or other similar manufacturing techniques. Alternatively, the wafer 235C may be formed with the through holes 402 in a previous step.

In step 454, as shown in FIGS. 4A and 5D, the lid 232 is bonded to the top surface 404 of the wafer 235C to enclose the lubricant channels 301 and cover one end of each through hole 402. Typical bonding processes may include anodic bonding (e.g., an electrolytic process), eutectic bonding, fusion bonding, covalent bonding, and/or glass frit fusion bonding processes. In one embodiment, the lid 232 is a display grade glass material (e.g., Corning® Eagle 2000™) and the wafer 235C is a silicon-containing material, and the lid 232 is bonded to the wafer 235C by use of a conventional anodic bonding technique. Typically the temperature of one or more of the components in the MEMS device package reaches between about 350° C. and about 450° C. during a conventional anodic bonding process. Additional information related to the anodic bonding process is provided in the commonly assigned U.S. patent application Ser. No. 11/028,946, filed on Jan. 3, 2005, which is herein incorporated by reference in its entirety.

In step 456, as shown in FIGS. 4A and 5E, the base 233, which has a plurality of MEMS devices 231 mounted thereon, is bonded to the back surface 405 of the wafer 235C to form an enclosed processing region 234 in which the MEMS device 231 resides. Typically, the base 233 is bonded to the wafer 235C using an anodic bonding (e.g., an electrolytic process), eutectic bonding, fusion bonding, covalent bonding, and/or glass frit fusion bonding process. In one embodiment, the base 233 is a silicon-containing substrate and wafer 235C is a silicon-containing wafer, and base 233 is bonded to the wafer 235C using a glass frit bonding process. Typically, the temperature of at least one or more of the components in the MEMS device package reaches a temperature between about 350° C. and about 450° C. during a glass frit bonding process. Additional information related to the glass frit bonding process is provided in the commonly assigned U.S. patent application Ser. No. 11/028,946, filed on Jan. 3, 2005, which has been incorporated by reference in its entirety.

Referring now to FIGS. 4A and 5F, in step 458, the wafer stack consisting of base 233, wafer 235C, and lid 232, is separated by use of a conventional dicing technique to form multiple MEMS device packages 230. The excess or scrap material 411, which is left over after the dicing process, may then be discarded. As part of step 458, conventional wire bonding and testing can be performed on the formed MEMS device to assure viability thereof and prepare the MEMS device for use in a system that may utilize the MEMS device package 230. Other dicing techniques can also be used to first expose the bond pads to allow wafer level probing and die sorting, followed by a full singulation.

Figure 6A:
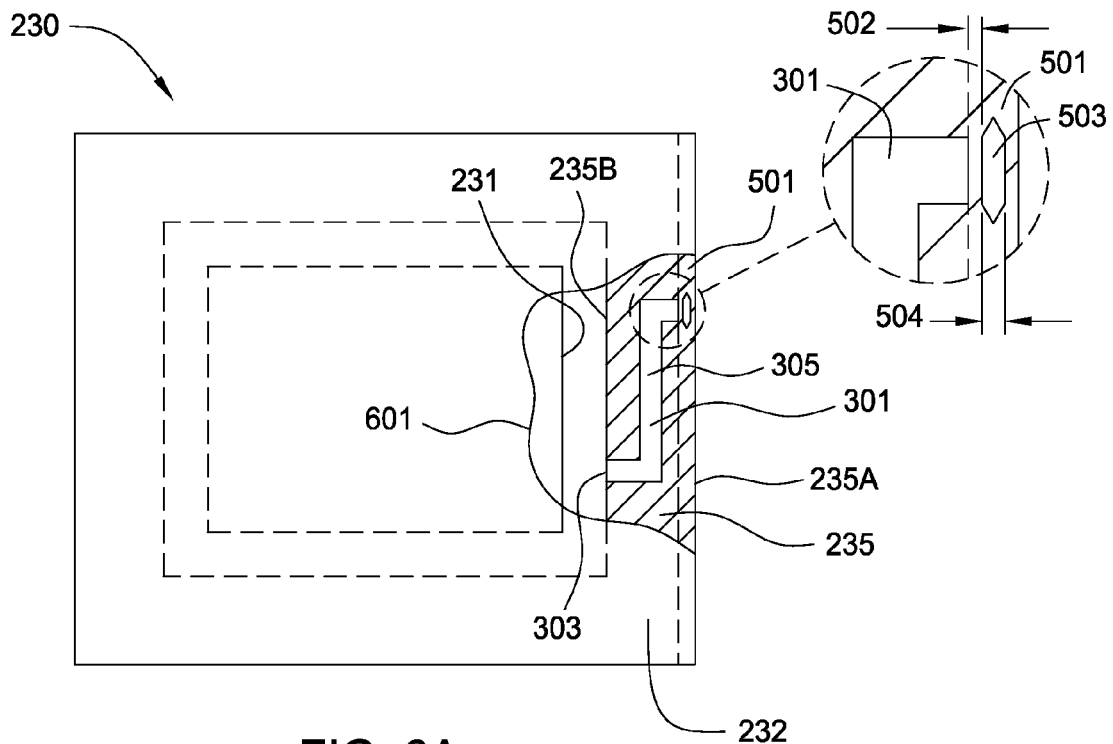
FIG. 6A illustrates a cross-sectional plan view of a device package assembly after performing multiple steps in the process sequence illustrated in FIG. 4A, according to one embodiment of the invention.

FIG. 6A is a plan view of a MEMS device package 230 having a partially formed lubricant channel 301 that may be formed using process steps 450 through step 458 shown in FIG. 4A. For clarity, MEMS device package 230 is illustrated with a partial section 601 of lid 232 removed. As shown, the lubricant channel 301 is only partially formed in the interposer 235 so that the end of the lubricant channel 301 proximate the exterior surface 235A is blocked by an excess interposer material 501 having a material thickness 502. In general, the material thickness 502 can be relatively thin to allow for easy removal of the excess interposer material 501 and may be about 10 micrometers (μm) to about 1 mm in thickness. In this configuration, the lubricant channel 301 is formed to extend from the exit port 303, which penetrates the interior surface 235B, to the opposing end, which is blocked by the excess interposer material 501. In this way, the processing region 234 remains sealed until the excess interposer material 501 is removed for injection of lubricant into the lubricant channel 301 during step 460 of FIG. 4A as described below.

Figure 6B:
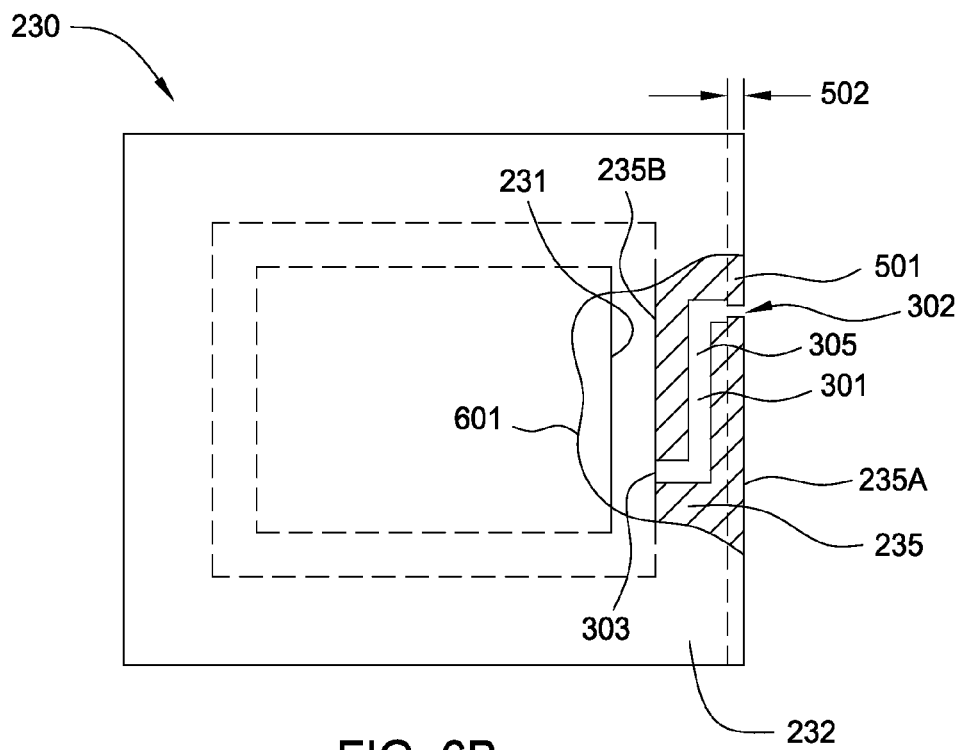
FIGS. 6B and 6C illustrate a channel inlet formed into a lubricant channel, according to embodiments of the invention.
Figure 6C:
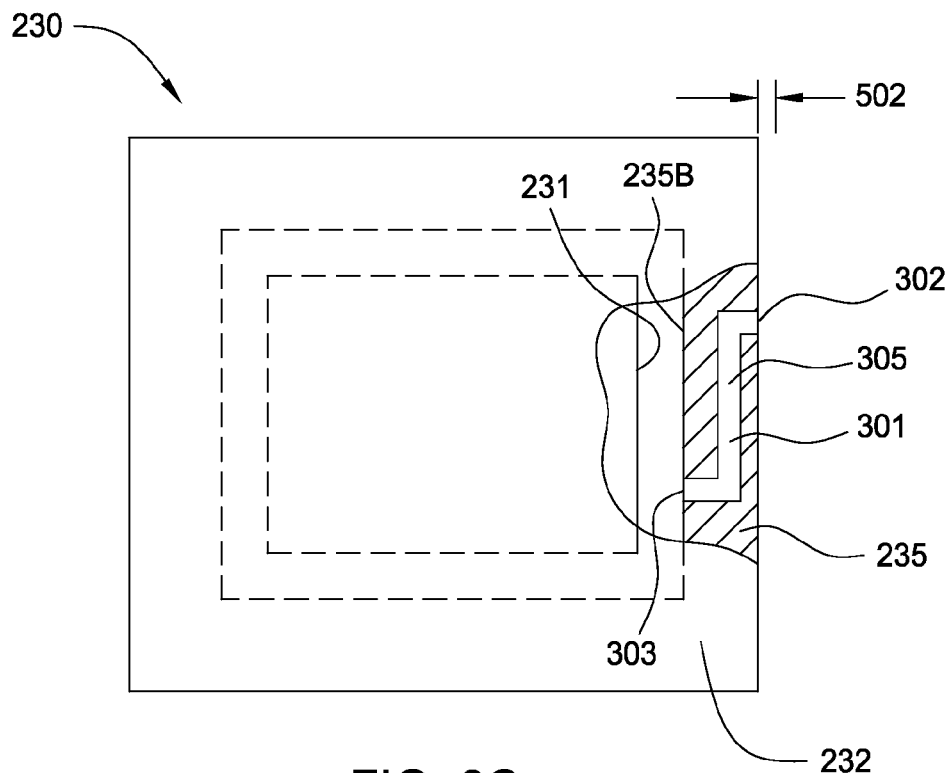

In step 460 of the process sequence 400, a channel inlet 302 is formed into the lubricant channel 301, as illustrated in FIGS. 6B and 6C. The channel inlet 302 may be formed by a step of puncturing the excess interposer material 501, as illustrated in FIG. 6B. Alternatively, the channel inlet 302 may be formed by performing a conventional abrasive, grinding, or polishing technique to remove substantially all of the excess interposer material 501 to expose the lubricant channel 301, as illustrated in FIG. 6C. In one aspect, it may be desirable to clean and remove any particles from the lubricant channel 301 created when the excess interposer material is removed to assure that particles cannot make their way into the processing region 234. Because the precision with which the excess interposer material 501 of the MEMS device package 230 can be removed is limited, a thickness control aperture 503 may be formed proximate the lubricant channel 301 during the formation of lubricant channel 301, as shown in FIG. 6A. During the process step of 458, materials on the right side of the aperture 503 is removed to expose the aperture 503. The presence of thickness control aperture 503 allows for a variation 504 (see FIG. 6A) in the removal of excess interposer material 501 without affecting material thickness 502.

In one embodiment, as illustrated in FIG. 6B, the channel inlet 302 is created by delivering energy, such as a laser pulse or an electron-beam pulse, to drill a hole through the excess interposer material 501 and into the lubricant channel 301. Laser drilling of channel inlet 302 may be performed using a short-pulse laser, such as an ultraviolet (UV) laser, or a long-pulse laser, such as an infra-red (IR) laser or constant (CW) laser. For example, when excess interposer material 501 is a silicon-containing material and material thickness 502 is about 100 to 200 μm thick, a Rofin 20E/SHG 532 nm Q-switch laser may be used. In this case, average power setting for the drilling process is between about 1.0 and about 2.5 W, approximately 3000 to 6000 pulses are used (depending on the exact thickness and composition of excess interposer material 501), Q switch frequency is less than about 15000 Hz, and pulse width is between about 6 ns and 18 ns. Alternatively, an IR laser may be used for laser drilling to form channel inlet 302, such as a 20 W fiber laser having a laser wavelength of 1.06 μm. In this case, between about 2,000 and 10,000 pulses are delivered, depending on the exact value of material thickness 502, and the pulses are delivered at a frequency between 25 kHz and 40 kHz. It is believed that the use of an IR laser versus a UV laser will reduce the number of particles produced during the drilling process due to the higher absorption of the energy at these wavelengths, which causes the heated material to form a liquid that will tend to adhere to the internal surfaces of the lubricant channel 301. Therefore, use of an IR laser can result in significant reduction in particulate contamination formed in the lubricant channel 301 and/or the processing region 234.

The inventors have also determined that particle generation during IR laser drilling can be minimized by optimizing settings of the laser. For example, when excess interposer material 501 is a silicon-containing material and material thickness 502 is about 100 to 200 μm thick, particle generation can also be minimized by adjusting the IR laser to form channel inlet 302 with a diameter between about 10 μm and about 30 μm. In addition, to minimize oxidation of the excess interposer material 501 during the laser drilling of step 460, the laser drilling process may be performed in an oxygen-free environment. For example, step 460 may take place in a chamber filled with an inert gas, e.g., nitrogen, or a noble gas, e.g., argon. Alternatively, the inert gas or noble gas may be used as a localized purge gas shield.

In one embodiment, the processing region 234 is filled with a gas during the formation of MEMS device package 230 to a pressure that is greater than atmospheric pressure so that any particles created during the removal of the excess interposer material 501 are urged away from the processing region 234 by the escaping gas. In one aspect, the processing region 234 is filled with a gas to a pressure higher than atmospheric pressure during step 456, i.e., the process of bonding the base 233 to the back surface 405 of the wafer 235C. In this case, the environment in which step 456 is performed is maintained at a pressure higher than atmospheric pressure so that higher than atmospheric pressure gas is trapped in the processing region 234 when fully formed. The gas retained in the processing region 234 may be an inert gas, such as nitrogen or argon.

In another embodiment, the device is placed in an o-ring sealed container with a transparent wall to allow the penetration of a UV or IR laser beam. The container is evacuated to a vacuum pressure in the millitorr regime prior to laser drilling to form channel inlet 302. The large pressure difference between the processing region 234 and the evacuated chamber further suppress the ingress of particles produced by laser drilling into the lubricant channel 301 during the formation of channel inlet 302. The container and the device are subsequently back-filled with desired gases, such as dry nitrogen or argon, prior to removing the device from the sealed container.

Figure 6D:
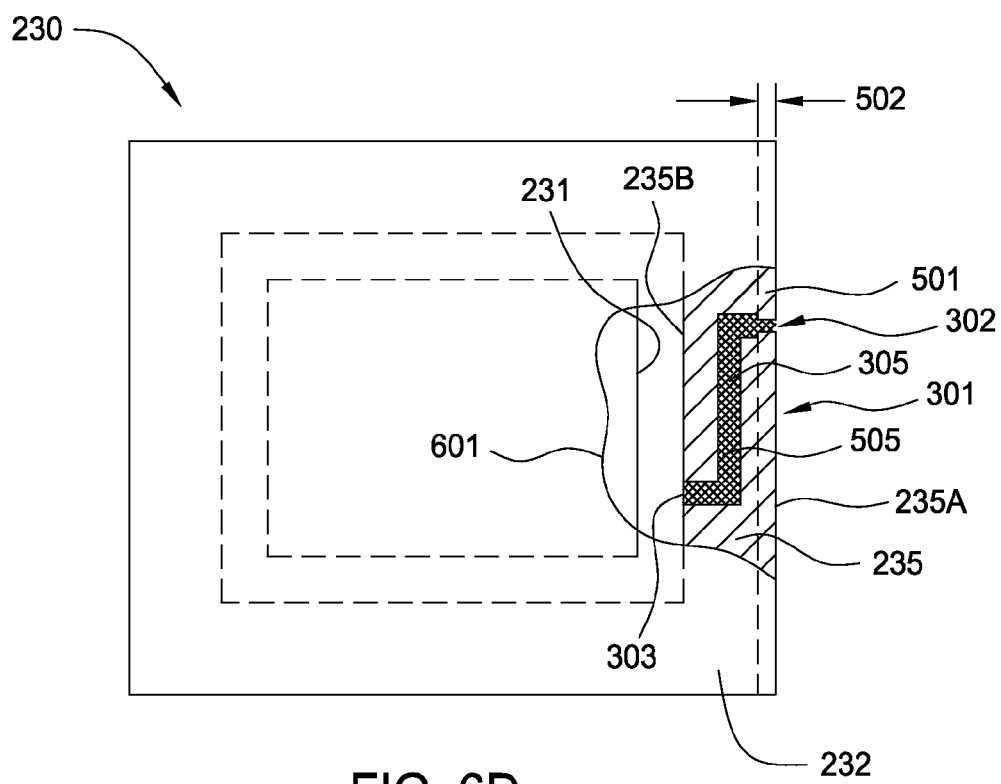
FIG. 6D illustrates a cross-sectional plan view of a device package assembly after a lubricant has been drawn into a lubricant channel, according to an embodiment of the invention.

Referring to FIG. 4A, in step 461, one or more lubricants are introduced into lubricant channel 301. As noted above in conjunction with FIG. 3E, lubricant channel 301 and channel inlet 302 may be configured so that capillary force draws the lubricant 505 into lubricant channel 301A, as illustrated in FIG. 6D. Hence, lubricant channel 301 may be filled with the lubricant 505 by placing a suitable quantity of lubricant 505 adjacent the channel inlet 302 on the exterior surface 235A with a syringe, pipette, or other similar device.

Figure 6E:
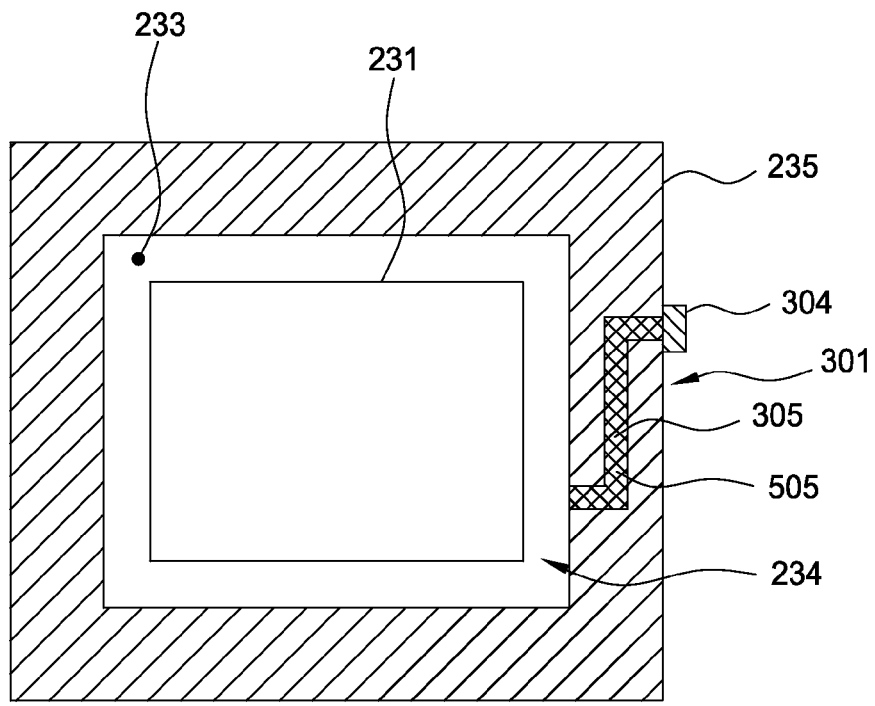
FIG. 6E illustrates a cap is installed over a channel inlet to seal a lubricant channel, according to an embodiment of the invention.

Referring to FIG. 4A, in step 462, channel inlet 302 is sealed to isolate the lubricant channel 301, the processing region 234, and the lubricant 505 disposed therein from the environment external to the MEMS device package 230. In one embodiment, a cap 304 is installed over the channel inlet 302 to seal lubricant channel 301, as illustrated in FIG. 6E. The composition of cap 304 is described above in conjunction with FIG. 3C. In another embodiment, a spot welding method, such as laser welding, may be used to seal channel inlet 302. In one aspect, a long-pulse laser or continuous laser, such as an IR laser, is used for this process. To minimize production costs, an IR laser substantially similar to the laser used in step 460, i.e., the step of forming channel inlet 302 through excess interposer material 501, may also be used in step 462, i.e., the step of sealing lubricant channel 301. For example, when excess interposer material 501 is a silicon-containing material and channel inlet 302 has a diameter of between about 10 μm and about 30 μm, a Rofin StarWeld 40 having a laser wavelength of 1.06 μm may be used in single pulse mode to seal channel inlet 302 with a pulse width of about 1 ms, an energy of between about 0.1 and 0.6 J, and a spot size between about 100 μm and 400 μm.

Figure 6F:
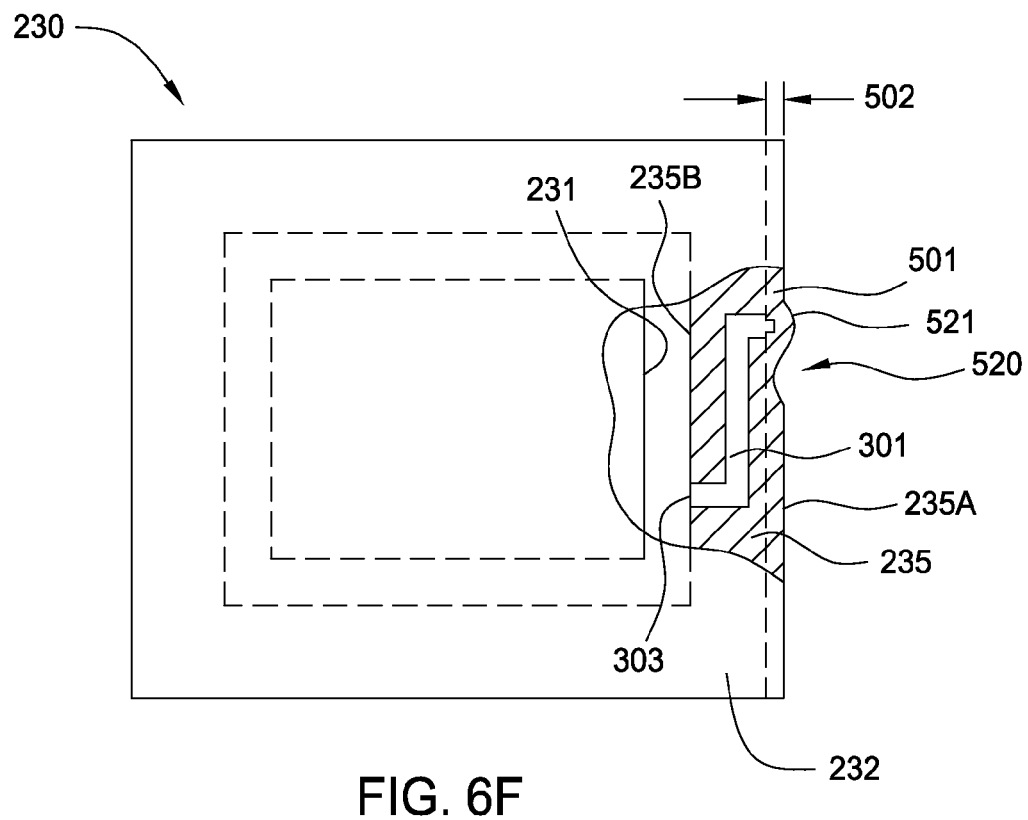
FIGS. 6F and 6G illustrate methods of sealing a lubricant channel using an IR laser, according to embodiments of the invention.

FIG. 6F illustrates a method of sealing lubricant channel 301 according to one embodiment, using an IR laser, wherein a laser is used to heat an area that is adjacent to the channel inlet 302, and thus some of the excess interposer material 501 is melted and is pushed over channel inlet 302. In this embodiment, a weld puddle 520 is formed on the exterior surface 235A with an IR or other long-pulse laser, and a portion 521 of the weld puddle 520 is displaced over channel inlet 302, thereby sealing lubricant channel 301.

Figure 6G:
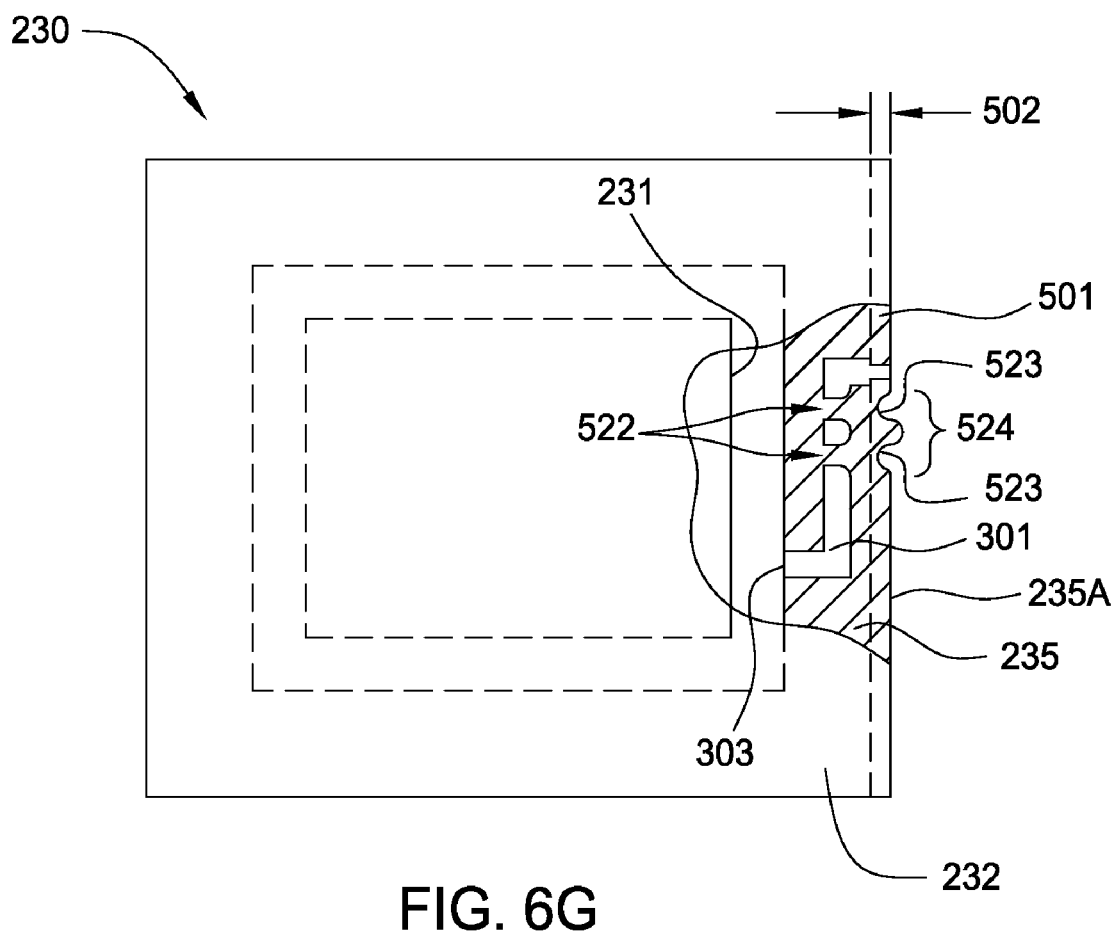

FIG. 6G illustrates another method of sealing lubricant channel 301 with an IR laser according to an embodiment, wherein one or more laser pulses are used to heat areas on the exterior surface 235A to create one or more seals 522 inside the lubricant channel 301. In this embodiment, one or more weld puddles 523 are formed in a sealing region 524 with sufficient energy to seal the lubricant channel 301 internally as shown. The geometry of lubricant channel 301 may be configured in weld region 524 to ensure that weld puddles 523 completely seal lubricant channel 301 from the ambient environment. For example, the portion of lubricant channel 301 corresponding to the location of weld puddles 523 may be positioned closer to exterior surface 235A and/or may be formed substantially narrower than the remaining portions of lubricant channel 301. Using weld puddles 523 to seal lubricant channel 301 as illustrated in FIG. 6G can minimize the amount of oxidized material that is contained in the seal.

Figure 4B:
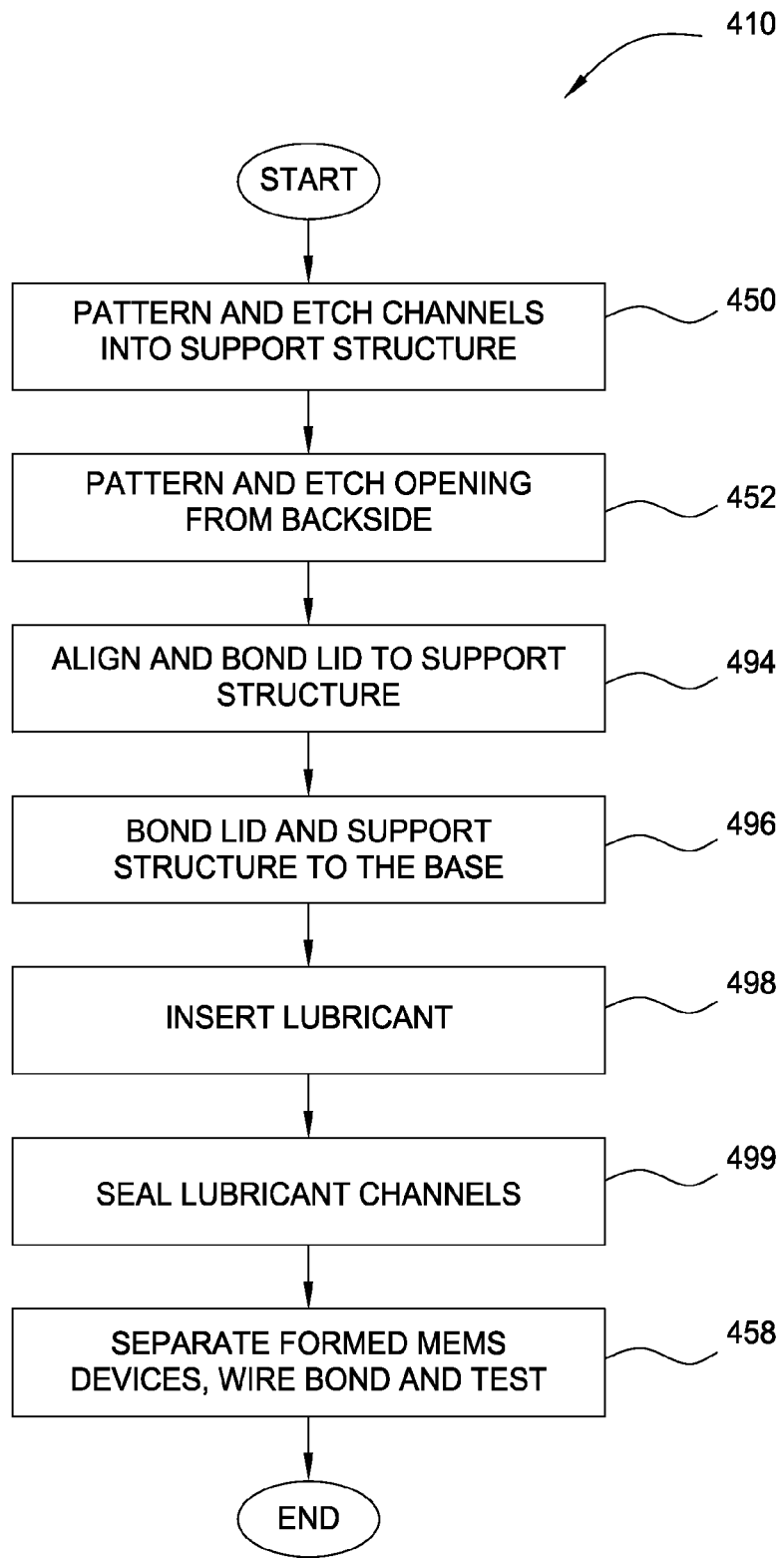

FIG. 4B illustrates a process sequence 410 for forming a MEMS device package 230 that contains a lubricant channel 301, according to one embodiment of the invention. Steps 450 and 452 in process sequence 410 are substantially the same as steps 450 and 452 in process sequence 400, and are described above in conjunction with FIGS. 4A, 5A, 5B, and 5C.

Figure 5G:
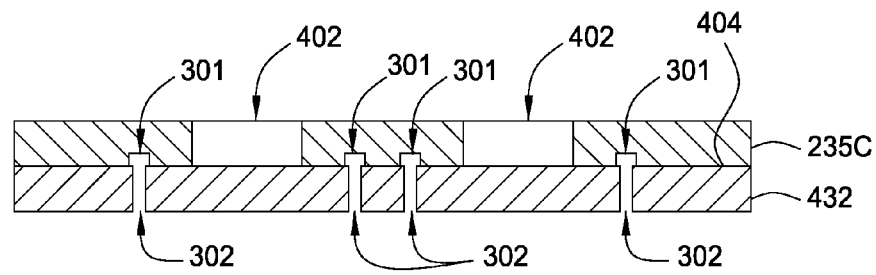
FIGS. 5A-5P illustrate the various states of one or more of the components of a MEMS device package after performing each step in the process sequences illustrated in FIGS. 4A, 4B and 4C.

Referring now to FIG. 4B, in step 494, a lid 432 with a plurality of channel inlets 302 is aligned with and bonded to the top surface 404 of the wafer 235C to enclose the lubricant channels 301 and cover one end of each through hole 402, as illustrated in FIG. 5G. FIG. 5G is a cross-sectional view of the wafer 235C and the lid 432 after bonding. Step 494 is substantially similar to step 454 of process sequence 410, except that the lid 432 includes a plurality of channel inlets 302 positioned to align with a portion of each lubricant channel 301 formed in the wafer 235C. Alternatively, the channel inlets 302 may be formed in the lid 432 after the lid 432 is bonded to the wafer 235C. In this case, the channel inlets 302 may be formed via lithographic, ablation, and/or etching techniques commonly known and used in the art. In either case, formation or alignment of the channel inlets 302 is part of the wafer-level process. As noted above, wafer-level processes generally reduce the cost to manufacture a device compared to chip-level processes.

Figure 5H:
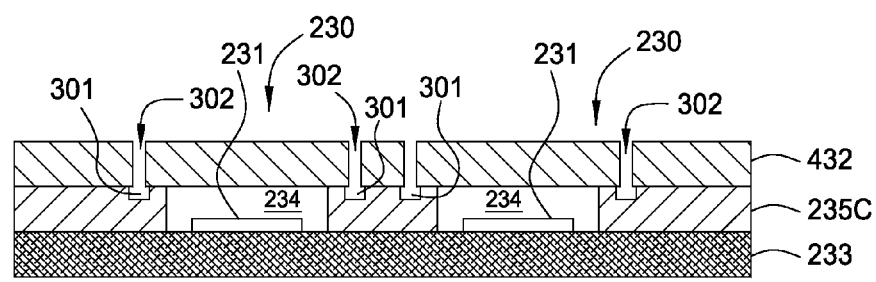

In step 496, as shown in FIGS. 4B and 5H, the base 233, which has a plurality of MEMS devices 231 mounted thereon, is bonded to the back surface 405 of the wafer 235C to form an enclosed processing region 234 in which the MEMS device 231 resides. Step 496 is substantially similar to step 456 of process sequence 400 in FIG. 4A.

Figure 5I:
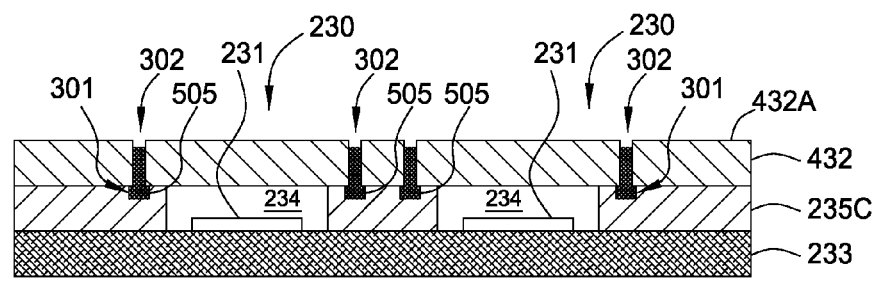

In step 498, as shown in FIGS. 4B and 5I, lubricant 505 is introduced into each lubricant channel 301 in a wafer-level process. In this embodiment, it is not necessary to dice the wafer stack consisting of the base 233, the wafer 235C, and the lid 232 into multiple MEMS device packages 230 prior to introducing the lubricant 505 into lubricant channels 301. Instead, a suitable quantity of the lubricant 505 may be placed adjacent to each opening in the channel inlet 302 on the upper surface 432A of the lid 432 by use of a syringe, pipette, or other similar device, and using capillary forces draw the lubricant 505 into each lubricant channel 301. In this way, the number of chip-level fabrication steps required to produce the MEMS device packages 230 is minimized.

Figure 5J:
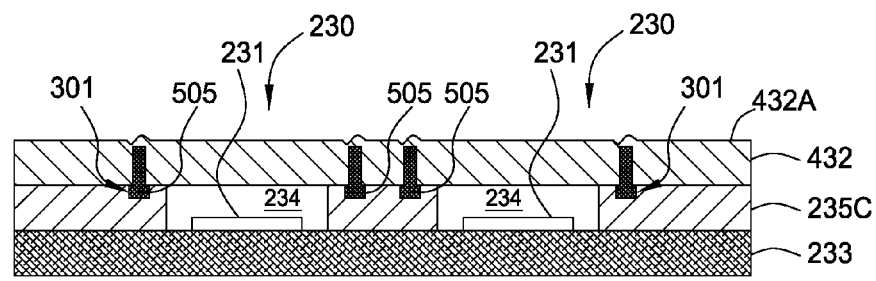

In step 499, as shown in FIGS. 4B and 5J, each channel inlet 302 is sealed to isolate the lubricant channels 301, the processing regions 234, and the lubricant 505 disposed therein from the environment external to the MEMS device package 230. Step 499 of process sequence 410 is substantially similar to step 462 of process sequence 400, except that in step 499 a wafer-level rather than chip-level process is used, thereby further reducing the number of chip-level fabrication steps required to produce the MEMS device packages 230. In the embodiment illustrated in FIG. 5J, the lubrication channels 301 have been sealed using laser welding, wherein a portion of the weld puddle formed on the upper surface 432A by an energy source (e.g., laser) is displaced to seal lubricant channel 301. Alternatively, the seal can be achieved by epoxy, eutectic solder, glass frit or other typical sealing materials.

Figure 5K:
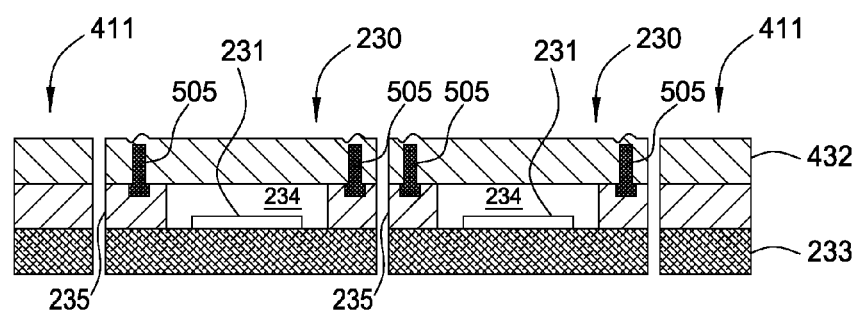

In step 458, as shown in FIGS. 4B and 5K, the wafer stack consisting of base 233, wafer 235C, and lid 232, is separated by use of a conventional dicing technique to form multiple MEMS device packages 230. Step 458 of process sequence 410 is substantially the same as step 458 in process sequence 400, and is described above in conjunction with FIGS. 4A and 5F. The excess or scrap material 411, which is left over after the dicing process, may then be discarded. As part of step 458, conventional wire bonding and testing can be performed on the formed MEMS device to assure viability thereof and prepare the MEMS device for use in a system that may utilize the MEMS device package 230. Other dicing techniques can also be used to first expose the bond pads to allow wafer level probing and die sorting, followed by a full singulation.

Figure 5L:
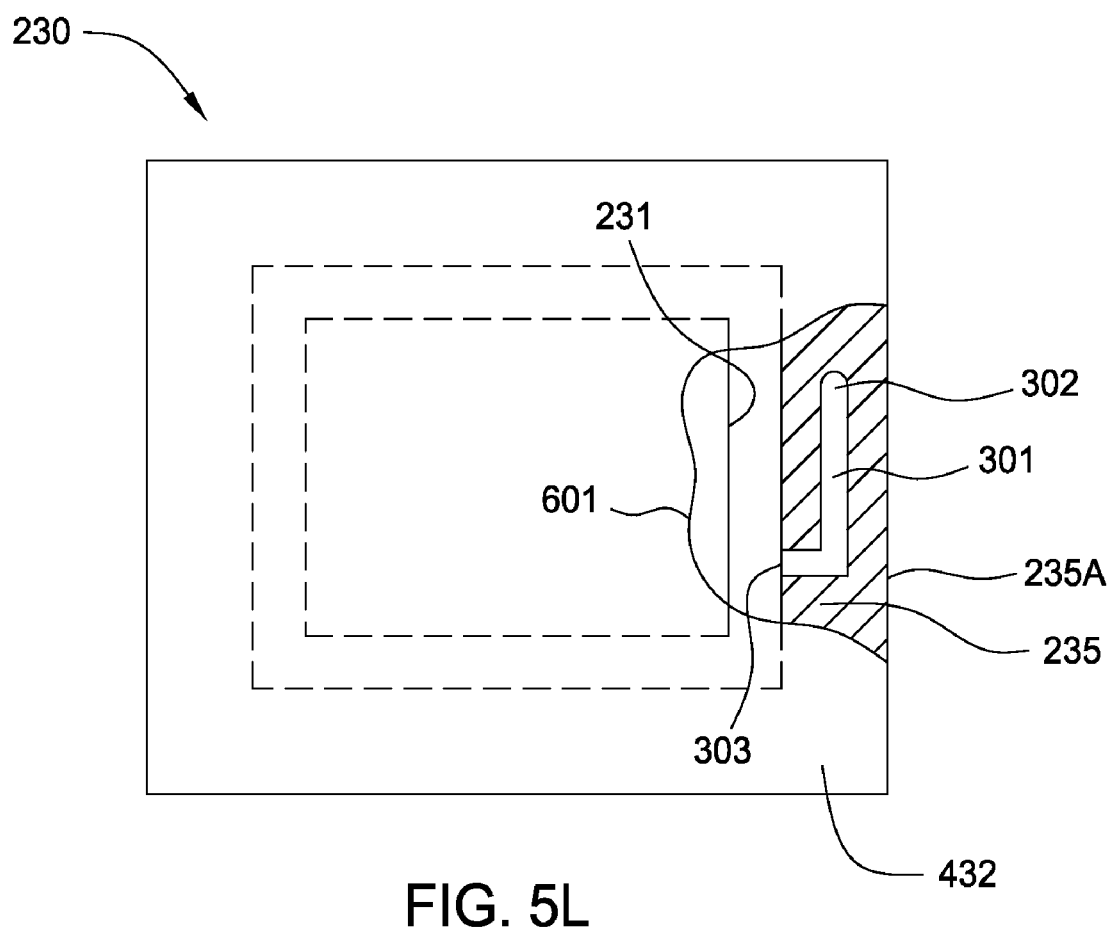

FIG. 5L illustrates a cross-sectional plan view of the device package assembly 230, where channel inlet 302 is formed in the lid 432 and does not penetrate exterior surface 235A, according to this embodiment of the invention.

Figure 4C:
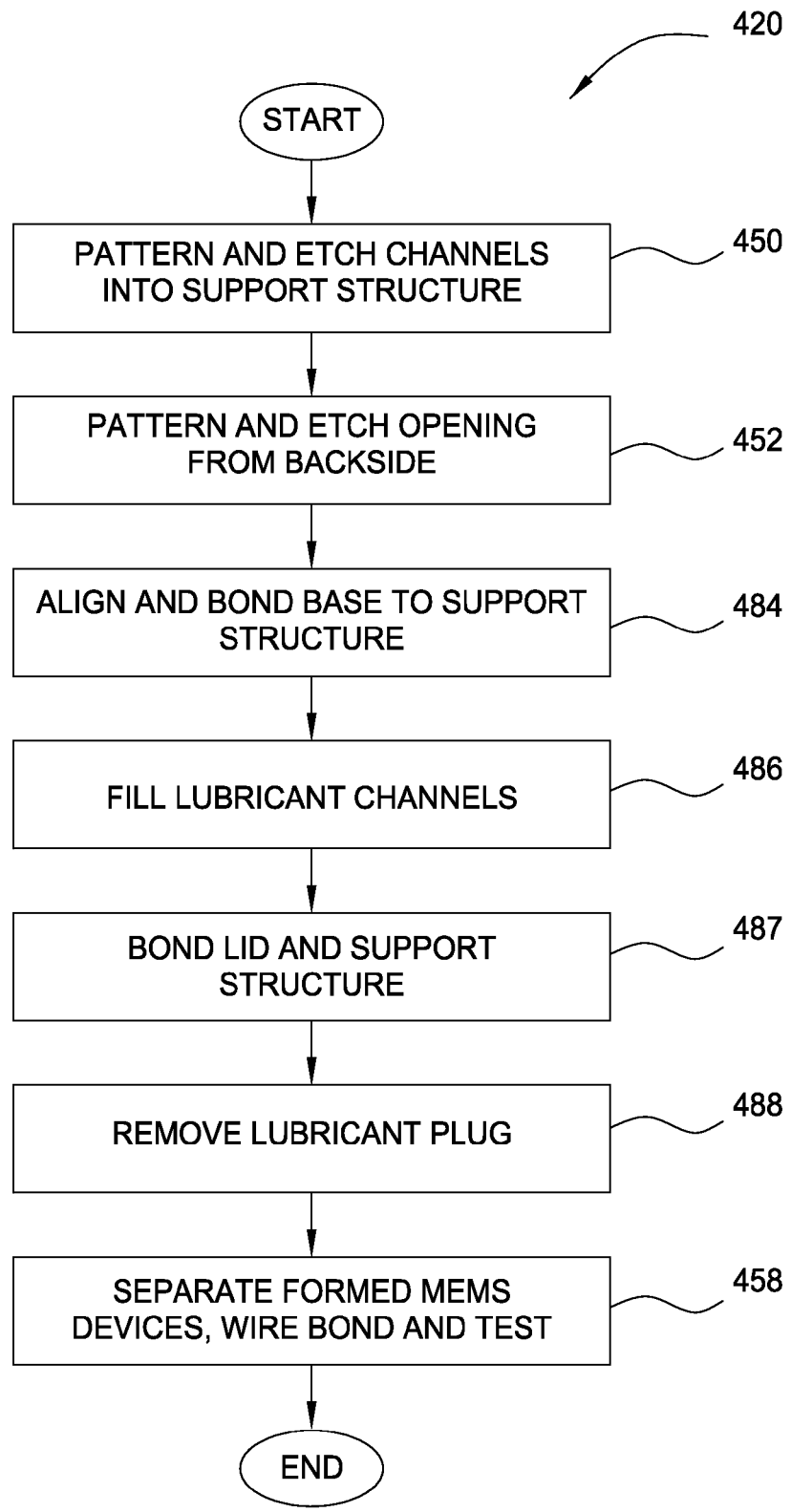

FIG. 4C illustrates a process sequence 420 for forming a MEMS device package 230 that contains a lubricant channel 301 and a removable lubricant plug, according to one embodiment of the invention. Steps 450 and 452 in process sequence 420 are substantially the same as steps 450 and 452 in process sequence 400, and are described above in conjunction with FIGS. 4A, 5A, 5B, and 5C.

Figure 5M:
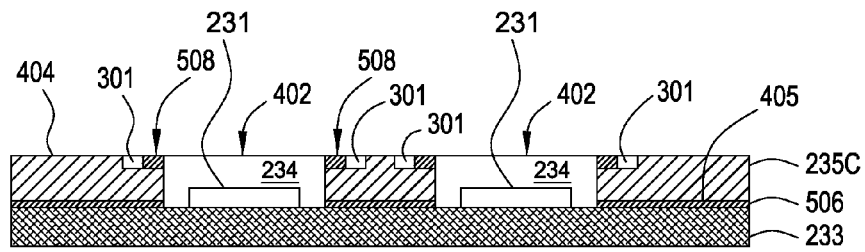

Referring now to FIG. 4C, in step 484, the base 233, which has a plurality of MEMS devices 231 mounted thereon, is aligned with and bonded to the back surface 405 of the wafer 235C with an epoxy layer 506, as illustrated in FIG. 5M. FIG. 5M is a cross-sectional view of the wafer 235C and the base 233 partially forming processing region 234 after bonding. The epoxy bonding process of step 484 is a low temperature process compared to anodic bonding, eutectic bonding, fusion bonding, covalent bonding, and/or glass frit fusion bonding. A lubricant plug 508 is also formed in each lubricant channel 301 as shown, to separate the processing region 234 from the lubricant channel 301. As described above, lubricant plug 508 may be a polymer, such as a photoresist, that converts to a porous material when exposed to UV or other wavelengths of radiation. Alternatively, lubricant plug 508 may be a polymer or other heat-sensitive material that breaks down or otherwise changes physical properties when exposed to heat.

Figure 5N:
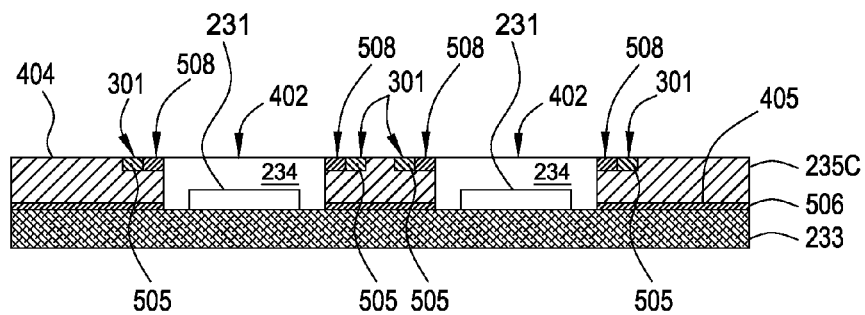

In step 486, as shown in FIGS. 4C and 5N, one or more lubricants are introduced into lubricant channel 301. Because in this process step lubricant channel 301 is an open channel, capillary force is not necessary to draw the lubricant 505 into lubricant channel 301. Lubricant plug 508 prevents lubricant 505 from entering processing region 234.

Figure 5O:
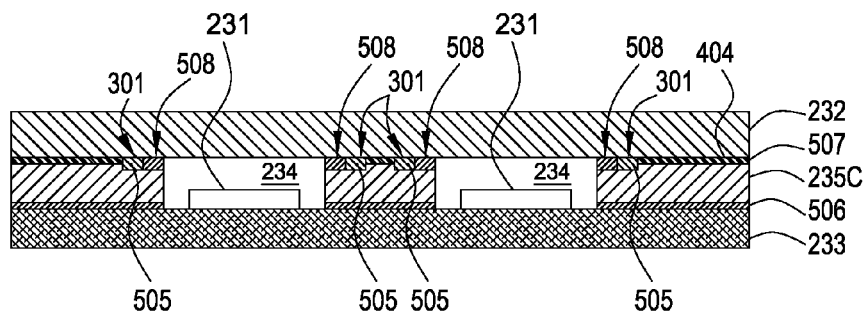

In step 487, as shown in FIGS. 4C and 5O, a lid 432 is aligned with and bonded to the top surface 404 of the wafer 235C with a second epoxy layer 507, as illustrated in FIG. 5O. FIG. 5O is a cross-sectional view of the wafer 235C, the base 233, and the lid 432 after bonding with the second epoxy layer 507. Bonding the lid 432 onto the top surface 404 encloses the lubricant channels 301 and the lubricant 505 contained therein, and completes the processing region 234 in which the MEMS device 231 resides.

Figure 5P:
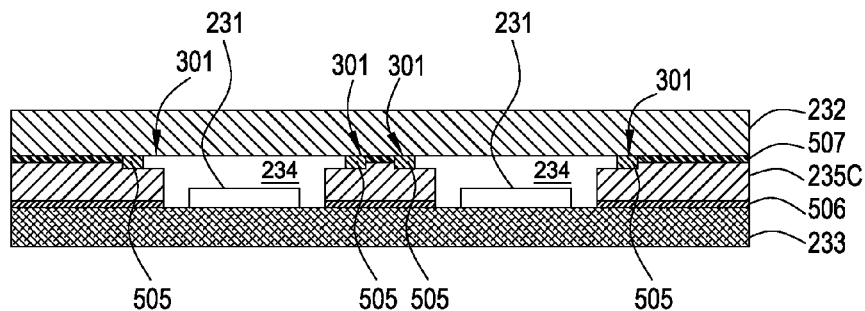

In step 488, as shown in FIGS. 4C and 5P, the seal of lubricant plug 508 is broken or physically altered to allow lubricant 505 into processing region 234. The removal process may involve exposure to UV radiation directed through lid 232 or exposure to heat.

In step 458, as shown in FIG. 4C, the wafer stack consisting of base 233, wafer 235C, and lid 232, is separated by use of a conventional dicing technique to form multiple MEMS device packages 230. Step 458 is described above in conjunction with FIGS. 4A and 5F.

In an alternative embodiment, the lubricant channel 301 is formed so that the contents of the lubricant channel 301 can be viewed through an optically transparent wall that encloses the processing region, such as the lid 232. In this configuration, the lubricant channel 301 is formed in the lid 232 or the interposer 235, so that the contents of the lubricant channel 301 can be viewed through the optically transparent lid 232. This configuration is useful since it allows the user to inspect the contents of the lubricant channel 301 to see how much lubricant 505 is left in the lubricant channel 301 so that corrective measures can be taken if necessary.

In another embodiment, control over the quantity of lubricant introduced into the lubricant channel 301 and the processing region 234 is improved by diluting the lubricant with another liquid prior to insertion of the lubricant into the MEMS device package 230. In some applications, accurate and repeatable delivery of the quantity of lubricant into the lubricant channel 301 is important. Too much lubricant can supersaturate the processing region 234 with lubricant vapor, resulting in condensed lubricant droplets that can produce stiction-related failures at contact regions between interacting MEMS components. Too little lubricant can shorten the lifetime of the MEMS device 231 contained in the MEMS device package 230. However, the volume of lubricant required for the MEMS device package 230 can be as little as on the order of nanoliters, and accurate volumetric delivery of liquids is only known for liquid volumes one or more orders of magnitude greater than this. The inventors have determined that by diluting the lubricant in another liquid, the volume of liquid introduced into the MEMS device package 230 can be increased significantly, e.g., ten times, or 100 times, without increasing the quantity of lubricant introduced into the MEMS device package 230. In one aspect of this embodiment, the lubricant is diluted with a significantly larger volume of solvent having a lower vapor pressure than the lubricant. After sealing the lubricant-solvent solution in lubricant channel 301, the MEMS device package 230 undergoes a bake-out and pump-down process to remove the solvent as overpressure causes vaporized solvent molecules to diffuse out of the MEMS package 230. In another aspect of this embodiment, the lubricant is mixed with a significantly larger volume of a liquid that has a higher vapor pressure than the lubricant and is at least slightly miscible with the lubricant. After sealing the combined lubricant and higher vapor pressure liquid in lubricant channel 301, the MEMS device package is baked-out at a temperature higher than the vaporization temperature of the lubricant, e.g., 200° C., and lower than the vaporization temperature of the higher vapor pressure liquid, e.g., 600° C. In this way the lubricant is activated, i.e., vaporized and allowed to diffuse into the processing region 234, while the miscible liquid containing the lubricant remains in place in the lubricant channel 301.

One advantage of the embodiments of the invention described herein relates to the general sequence and timing of delivering the lubricant 505 to the formed MEMS device package 230. In general, one or more embodiments of the invention described herein provide a sequence in which the lubricant 505 is delivered into the processing region after all high temperature MEMS device packaging processes have been performed, e.g., anodic bonding and glass frit bonding. This sequence reduces or prevents the premature release or breakdown of the lubricant that occurs during such high temperature bonding processes, which reach temperatures of 250° C. to 450° C. The ability to place the lubricant 505 into the lubricant channel 301 and processing region 234 after performing the high temperature bonding steps allows one to select a lubricant material that would degrade at the typical bonding temperatures and/or reduce the chances that the lubricant material will breakdown or be damaged during the MEMS device forming process. One skilled in the art will also appreciate that a lubricant channel 301 formed in a MEMS device package using a chip-level packaging process versus a wafer-level packaging process benefits from the delivery of the lubricant 505 after the MEMS device package sealing processes (e.g., anodic bonding, TIG welding, e-beam welding) are performed.

Another advantage of the embodiments of the invention described herein relate to the reduced number of processing steps required to form a MEMS device package and the reduced number of steps that need to be performed in a clean room environment. Conventional MEMS device fabrication processes that utilize a reversibly absorbing getter require the additional steps of 1) bonding the getter material to a surface of the lid or other component prior to forming a sealed MEMS device package, and 2) heating the package to activate the getter device. The removal of these steps reduces the number of process sequence steps that need to performed in a clean room environment and thus reduces the cost of forming the MEMS device. The presence of the conventional reversibly absorbing getter also limits the temperature at which the MEMS device package can be hermetically sealed, especially for wafer-level processing.

Lubricant Channel Configurations

While the preceding discussion only illustrates a MEMS device package that has a single lubricant channel to deliver the lubricant material to the processing region 234, it may be advantageous to form a plurality of lubricant channels 301 having different geometric characteristics and positions within the MEMS device package 230 to better distribute the mobile lubricant within the MEMS package. It is also contemplated that geometrical features may be advantageously incorporated into a lubricant channel to act as particle filters or particle traps.

Figure 7A:
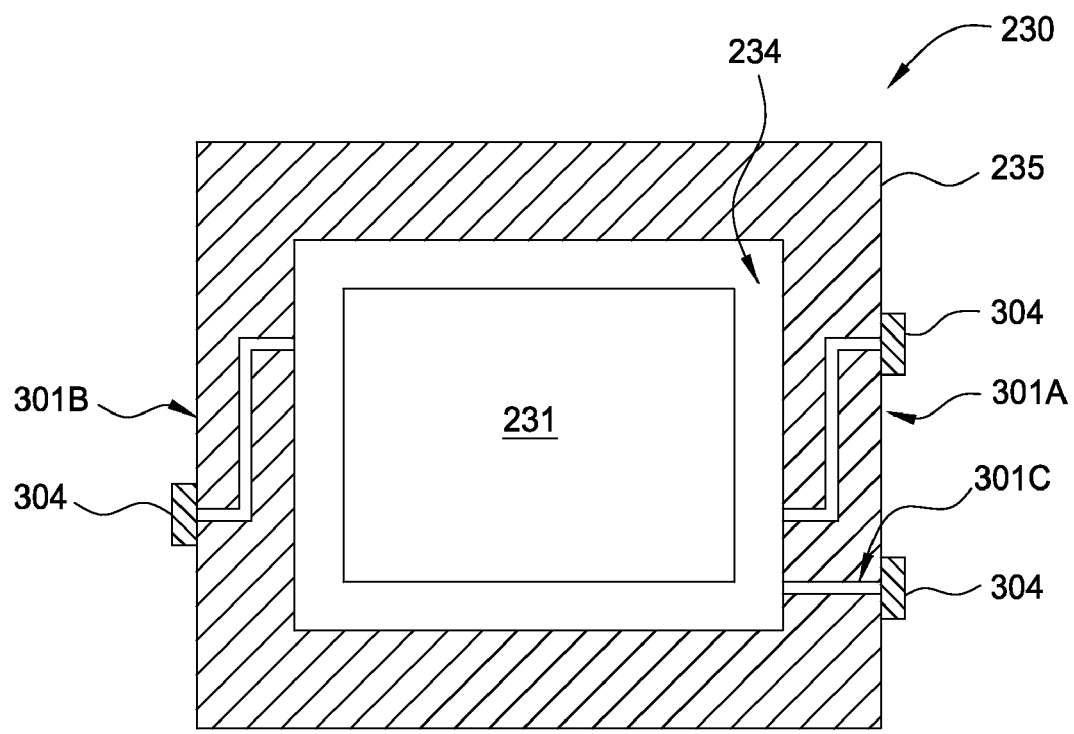
FIG. 7A illustrates a cross-sectional plan view of a device package assembly, according to one embodiment of the invention.

The geometric attributes of each lubricant channel can be used to deliver differing amounts of mobile lubricants at different stages of the products lifetime. FIG. 7A is a cross-sectional plan view of a MEMS device package 230 that has multiple lubricant channels 301A-301C that are formed having differing lengths, shapes and volumes. In one aspect, it is desirable to uniformly distribute the lubricant channels, such as lubricant channels 301A and 301B, in different areas of the MEMS device package 230 so that the distribution of lubricant molecules from the lubricant channels is relatively uniform throughout the MEMS device package. This is particularly beneficial to device with large die dimensions. In one case, the length of the lubricant channels 301A and 301C may be adjusted to reduce the manufacturing cost or optimize the volume of lubricant contained within the lubricant channel.

In one embodiment, it may be desirable to form a plurality of lubricant channels that each deliver or contain a different lubricant material having different lubricating properties and/or migration properties. In one embodiment, a first type of mobile lubricant molecule could be transported through or stored in the lubricant channel 301A and a second type of mobile lubricant molecule could be transported through or stored in the lubricant channel 301B, where the first and second mobile lubricant molecules each have different equilibrium partial pressures during normal operation of the device and/or each lubricant has a different migration rate throughout the package.

In another embodiment, first and second type of mobile lubricant molecules are introduced into the processing region 234, where the first type of mobile lubricant molecule is selected for its bonding properties to the internal surfaces of the processing region 234 and the second type of mobile lubricant molecule is selected for its bonding properties to the first type of mobile lubricant molecule. In this way, the first type of lubricant molecule is introduced into the processing region 234 via one or more lubricant channels to form a uniform monolayer on internal surfaces of the processing region 234. The second type of mobile lubricant molecule is then introduced into the processing region 234 via one or more lubricant channels to form one or more monolayers on the first lubricant. The multiple monolayers of mobile lubricant molecules then serve as a lubricant reservoir throughout the life of the MEMS device. In one aspect, it may be desirable to tailor the geometry, volume, and surface roughness of the lubricant channels described herein to correspond to the type of lubricant processed within them.

Figure 7B:
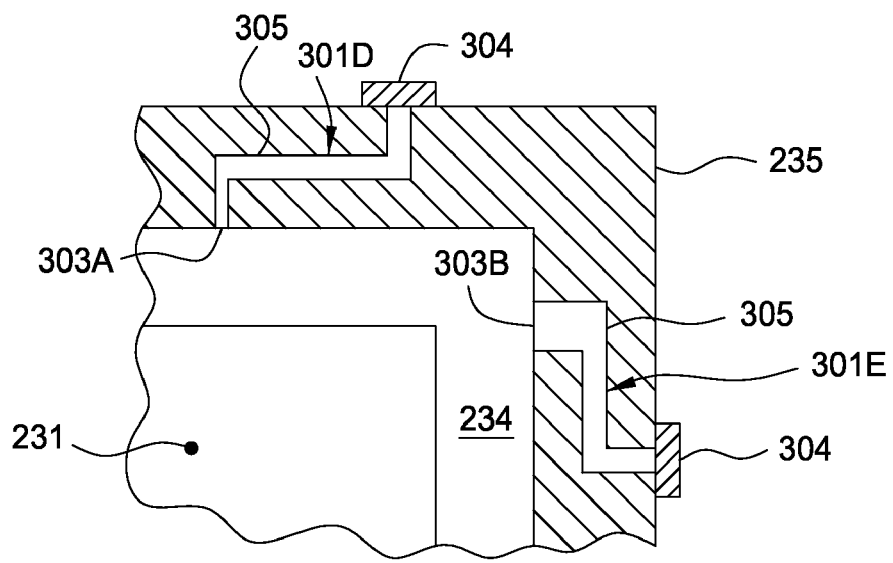
FIG. 7B illustrates a close-up of a partial section view of a device package assembly, according to one embodiment of the invention.

FIG. 7B is a cross-sectional view of a wall containing two lubricant channels 301D and 301E that have an exit port 303A or 303B that have a differing geometry to control the rate of lubricant migrating into the processing region. As shown, it may be desirable to have a first lubricant channel 301D that has an exit port 303A with a small cross-sectional area to reduce the diffusion and/or effusion of lubricant into the processing region 234, and a second lubricant channel 301E that has an exit port 303B that has a large cross-sectional area to allow for a rapid diffusion and/or effusion of lubricant into the processing region 234. When these two configurations are used in conjunction with each other, the second lubricant channel 301E can be used to rapidly saturate the surfaces within the processing region 234 during the startup of the MEMS device. However, the first lubricant channel 301D can be used to slowly deliver fresh lubricant to the processing region 234 throughout the life of the device.

Figure 7C:
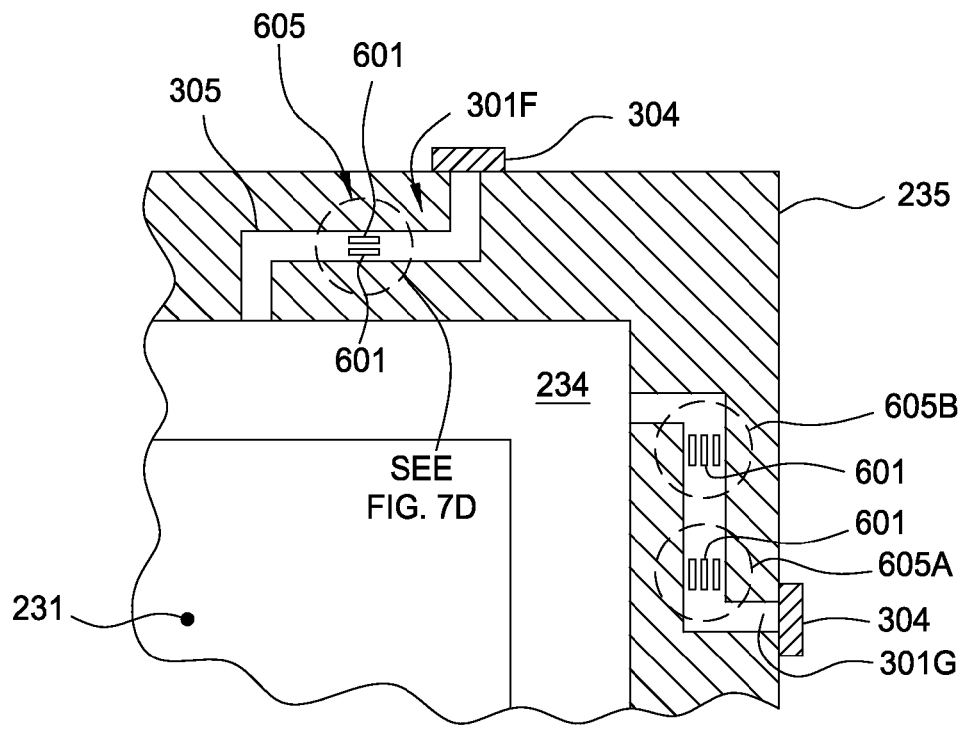
FIG. 7C illustrates a close-up of a partial section view of a device package assembly, according to one embodiment of the invention.
Figure 7D:
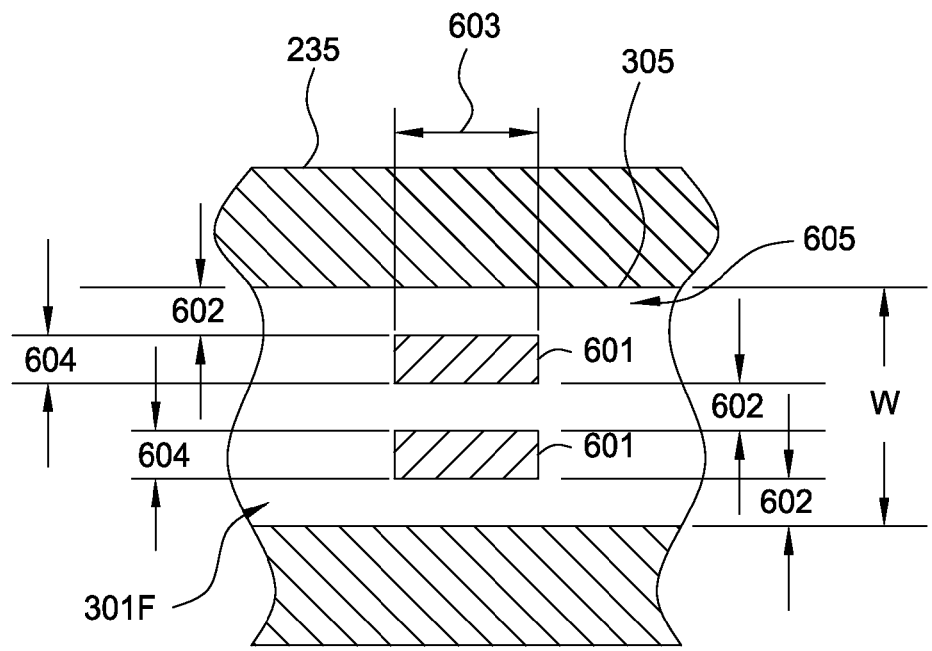
FIG. 7D illustrates a close-up of a partial section view illustrated in FIG. 7C, according to one embodiment of the invention.

FIGS. 7C and 7D illustrate another embodiment of a lubricant channel 301F that contains a filter region 605 that contains a plurality of obstructions 601 that are used to minimize the influx of particles of a certain size into the processing region 234 from the environment outside the MEMS device package 230. The obstructions 601 are generally configured to have a desired length 603, width 604 and height (not shown, i.e., into the page) and have a desired spacing 602 between each of the obstructions 601, and thus act as a filter to prevent the influx of particles of a certain size into the processing region 234. The obstructions 601 may be formed in the lubricant channel 301F using conventional patterning, lithography and dry etch techniques during the process of forming the lubricant channel 301F. In one embodiment, the width W of lubricant channel 301F and the orientation of the obstructions 601 disposed in the lubricant channel 301F are configured to maximize the influx of the lubricant into the processing region. In another embodiment, the width W of lubricant channel 301F and the orientation of the obstructions 601 disposed therein are configured to control the flow of the lubricant. Generally, it is desirable to select the number and orientation of the obstructions 601, and the spacing 602 and depth (not shown; i.e., into the page of FIG. 7D) of the spaces between the obstructions 601 so that a particle of desired size is unable to pass into the processing region 234. In one embodiment, the obstructions 601 have a length between about 50 μm and about 200 μm, a width between about 1 μm and about 50 μm, and the spacing 602 is between about 1 μm and about 20 μm. In this embodiment, particles as small as 1 μm in size can be prevented from entering processing region 234. In one aspect, the depth of the spacings 602 may be the same as the depth of the channel.

In another embodiment, the lubricant channel 301G contains a number of arrays of obstructions 601 that are staggered relative to each other along a portion of the length of the lubricant channel 301G. In this configuration, particles having a dimension smaller than the clearance of the filter, i.e., spacing 602, can also be blocked efficiently. In another embodiment, multiple groups of obstructions 601, or multiple filter regions 605, are placed in different areas of the lubricant channel to further prevent particles from entering the processing region of the formed device. For example, as shown in FIG. 7C, it may be desirable to have one filter region 605A near the inlet of the lubricant channel to collect particles that may enter from outside of the MEMS device package and another filter region 605B positioned in the lubricant channel near the processing region that acts as a final filtration device before entering the processing region 234.

Figure 7E:
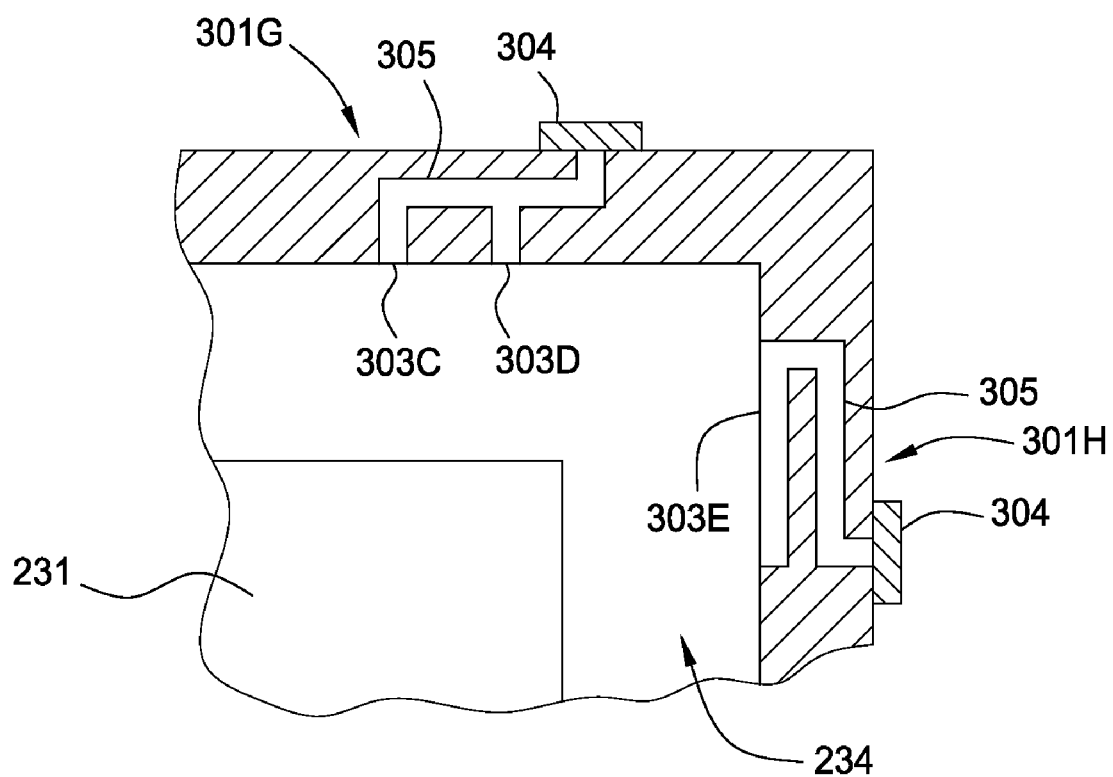
FIG. 7E illustrates a close-up of a partial section view of a device package assembly, according to one embodiment of the invention.

FIG. 7E is a cross-sectional view of a wall containing two lubricant channels that have differing exit port configurations that may be useful to enhance the distribution or delivery of the lubricant to the processing region 234. In one embodiment, a lubricant channel 301G has multiple outlets (e.g., exit ports 303C-303D) that are adapted to improve the rate of delivery of the lubricant to the processing region and/or improve the distribution of lubricant to different areas of the processing region. In another embodiment, the lubricant channel 301H has a large exit port 303E that acts a nozzle, which promotes the delivery of lubricant to the processing region 234.

Figure 8:
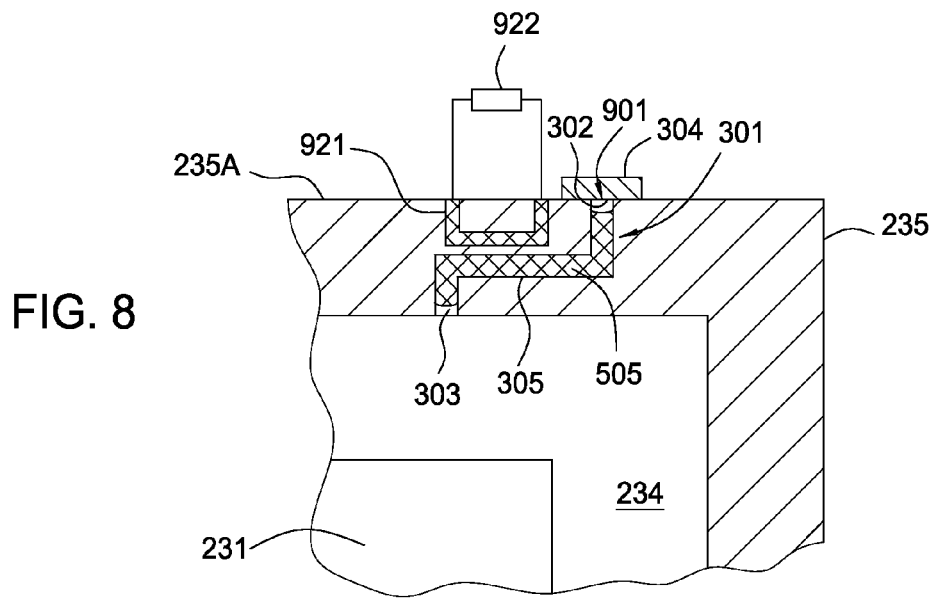
FIG. 8 illustrates a close-up of a partial section view of a device package assembly, according to one embodiment of the invention.

In another embodiment, as shown in FIG. 8, the temperature of the lubricant contained in the lubricant channel 301 may be controlled using a resistive element 921 and a temperature controller 922 for more controlled delivery of the lubricant. In this configuration, the controller 922 is adapted to deliver a desired amount of power to the resistive elements 921 to control the temperature of the lubricant disposed in the lubricant channel 301, and thus control the rate of lubricant migration to the processing region 234. In another aspect, the resistive element 921 is mounted on the exterior surface 235A of one of the walls that encloses the processing region 234, to facilitate control of lubricant temperature within the lubricant channel 301. In one aspect, the resistive element 921 is a metal foil that is deposited on a surface of one of the walls that encloses the processing region 234. One should note that the migration rate of the lubricant from the lubricant channel 301 is strongly dependent on the temperature of the lubricant, since vaporization and diffusion are both thermally activated processes.

In one embodiment, a volume of gas 901 (FIG. 8) may be purposely injected into the lubricant channel 301 prior to covering the channel inlet 302 with the cap 304 to provide a buffer and a temperature-compensating mechanism that controls the rate of delivery to the processing region 234. In this configuration, the volume of gas 901 expands as the temperature increases, which causes the lubricant disposed in the lubricant channel 301 to be pushed towards the exit port 303, and retract when the temperature in the lubricant channel 301 drops. In one embodiment, where the lubricant is a viscous liquid and/or has a strong adhesion to internal surfaces of the lubricant channel 301, the volume of gas 901 may be added at a pressure that is slightly higher than the pressure in the processing region 234. This allows the gas to slowly deliver the lubricant to the processing region as the volume of gas expands to compensate for the pressure difference.

Figure 9A:
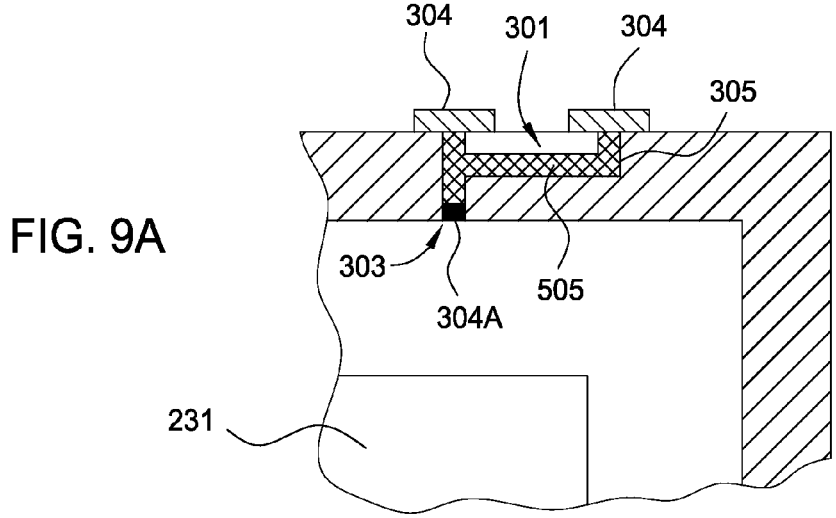
FIGS. 9A and 9B illustrate a close-up of a partial section view of a device package assembly, according to one embodiment of the invention.

In one embodiment, as shown in FIG. 9A, a cap 304A may be inserted at the exit port 303 to isolate the lubricant channel 301 from the processing region 234, until it is desirable to remove the cap 304A to allow the lubricant 505 to enter the processing region 234. In one aspect, the cap 304A is a polymer, such as a photoresist, that remains in place over the exit port 303 until it is exposed to some form of optical radiation or heating that induces a phase separation or change of the physical properties of the material contained in the cap 304, thereby converting cap 304A into a porous material. This configuration is especially useful in configurations in which the lubricant channel 301 is positioned adjacent to a lid 232 (see FIGS. 2A and 6B) formed from an optically transparent material that passes the desired wavelength of light to break down the material of cap 304A. In another embodiment, the cap 304A is adapted to breakdown at an elevated temperature. This configuration allows the encapsulation of a desired quantity of lubricant in the lubricant channel 301 prior to bonding the device substrate with a lower temperature sealing method, e.g., epoxy sealing. Release of the lubricant can be initiated any time after the sealing process is completed.

Figure 9B:
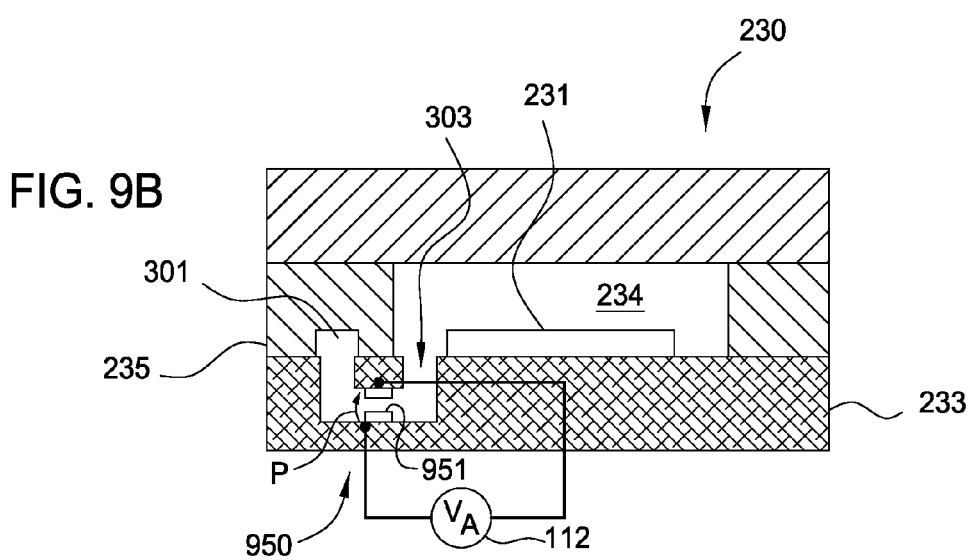

In one embodiment, at least a portion of the lubricant channel 301 and a MEMS device element 950 are formed on the base 233 as illustrated in FIG. 9B. The remainder of lubricant channel 301 may be formed in a wall of an interposer 235, as shown, or entirely in base 233. The MEMS device element 950 is disposed proximate the portion of lubricant channel 301 formed in base 233 so that a portion 951 of the MEMS device element 950 can be actuated to cover the exit port 303 of the lubricant channel 301. The MEMS device element 950 can be formed in base 233 at the same time that MEMS device 231 is formed. In this configuration, the MEMS device element 950 can be externally actuated by a power supply 112 to cover or expose the exit port 303 so that the MEMS device element 950 acts as a valve that can regulate the flow of lubricant material from the lubricant channel 301. The portion 951 may pivot (see "P" in FIG. 9B) to cover the exit port 303 by use of a bias applied by the power supply 112.

Figure 10A:
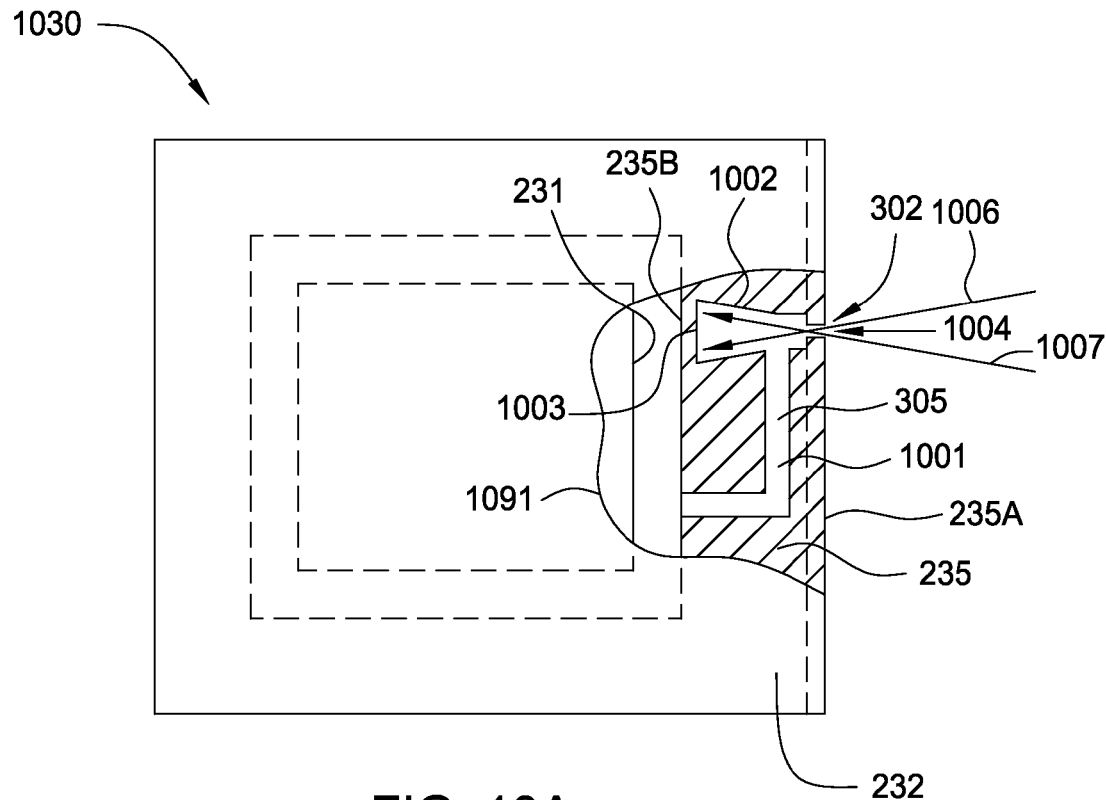
FIG. 10A is a plan view of a MEMS device package having a lubricant channel formed with a particle trap, according to an embodiment of the invention.
Figure 10B:
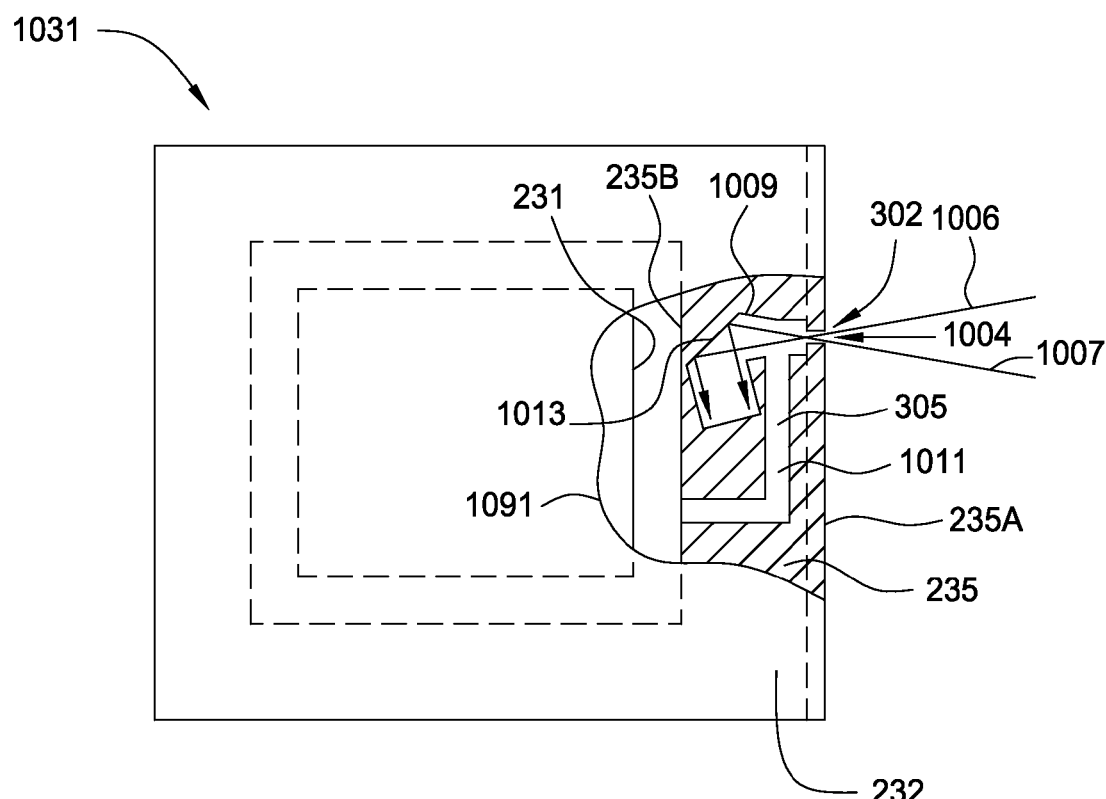
FIG. 10B is a plan view of a MEMS device package having a lubricant channel formed with a non-linear particle trap, according to an embodiment of the invention.

In one embodiment, a lubricant channel contained in a wall that encloses the processing region of a MEMS package includes one or more geometrical features that serve as particle traps, as illustrated in FIGS. 10A and 10B. FIG. 10A is a plan view of a MEMS device package 1030 having a lubricant channel 1001 formed with a particle trap 1002, according to an embodiment of the invention. For clarity, MEMS device package 1030 is illustrated with a partial section 1091 of the lid 232 removed. As shown, lubricant channel 1001 is formed in the interposer 235 and extends from the exterior surface 235A to the interior surface 235B of the interposer 235. The lubricant channel 1001 is substantially similar to the lubricant channel 301, described above, except that the lubricant channel 1001 is formed with the particle trap 1002. The particle trap 1002 is a cavity formed in fluid communication with the internal region 305 of the lubricant channel 1001 and positioned opposite the channel inlet 302. Because of the placement of the particle trap 1002, a substantial portion of particles urged into the internal region 305 when the channel inlet 302 is formed by a material removal or other similar process will be collected inside the particle trap 1002. This is particularly true when a laser drilling process is used to form channel inlet 302. As shown, particle trap 1002 is a dead space, i.e., a "dead end" volume that is not a part of the fluid passage between the exterior surface 235A and the interior surface 235B of the interposer 235. Therefore, particles collected in the particle trap 1002 are not carried into the processing region 234 inside the MEMS device package 1030 when lubricant is introduced into the lubricant channel 1001 via the channel inlet 302.

To further reduce the number of particles carried into the processing region 234, particle trap 1002 may also be configured to reduce the number of particles generated in internal region 305 when laser drilling is used to form channel inlet 302. The inventors have determined that a laser beam can blaze surfaces of internal region 305 during laser drilling, producing particles. An internal surface 1003 of internal region 305 can be ablated by the drilling laser after channel inlet 302 is formed and prior to laser shut-off. To minimize the number of particles produced by ablation of the surface 1003 by the drilling laser, the particle trap 1002 may be configured so that the surface 1003 is positioned away from the focal point 1004 of the drilling laser. Focal point 1004, which is indicated by the intersection of rays 1006 and 1007, is substantially coincident with the channel inlet 302. By positioning the surface 1003 away from the focal point 1004 and the channel inlet 302, the energy density of the penetrating laser beam is reduced when incident on the surface 1003. It is believed that by so doing, fewer particles are formed in internal region 305. It is also believed that particles that are present in internal region 305 are generally fused onto surface 1003 and other internal surfaces, and are therefore immobile particles that cannot be carried into processing region 234.

FIG. 10B is a plan view of a MEMS device package 1031 having a lubricant channel 1011 formed with a non-linear particle trap 1009, according to an embodiment of the invention. In this embodiment, the lubricant channel 1011 is substantially similar to the lubricant channel 1001 in FIG. 10A, except that the lubricant channel 1011 is formed with the non-linear particle trap 1009. In this embodiment, the non-linear particle trap 1009 positions a surface 1013 a distance from the focal point 1004 of the penetrating laser beam and further isolates particles collected in non-linear particle trap 1009 from the fluid passage between the exterior surface 235A and the interior surface 235B of the interposer 235. In the embodiment illustrated in FIG. 10B, non-linear particle trap 1009 is configured with a single 90° bend, but it is contemplated that non-linear particle trap 1009 may also be configured with one or more bends of greater than or less than 90° to collect particles formed during the formation of the channel inlet 302.

Lubricant Removal Steps

In one embodiment, it is desirable to connect a pump (not shown) to the channel inlet 302 (shown in FIG. 6B) so that it can be used to evacuate the processing region to remove one or more of the mobile lubricants and/or dilutent contained therein. In this case the pump may be used to evacuate the processing region to a sufficient pressure to cause the lubricant to vaporize and thus be swept from the device package. In another embodiment, it may be desirable to connect a gas source (not shown) to one injection port (e.g., element 301A in FIG. 7A) and then remove a cap (e.g., element 304 in FIG. 7A) from another injection port (e.g., element 301B in FIG. 7A) so that gas delivered from the gas source can be used to sweep out any used or degraded lubricant material. In either case, these types of techniques can be used to remove old and/or degraded lubricant material so that new lubricant material can be added to the processing region, using the methods described above, to extend the life of the MEMS device.

While the foregoing is directed to embodiments of the present invention, other and further embodiments of the invention may be devised without departing from the basic scope thereof, and the scope thereof is determined by the claims that follow.

We claim:
1. A device assembly, comprising:
 a micromechanical device enclosed within a processing region; and
 a lubricant channel formed through at least one interior wall of the processing region to be in fluid communication with the processing region, wherein a substantial length of the lubricant channel extends into said at least one interior wall to be completely enclosed thereby.

2. The device assembly of claim 1, wherein a volume of the lubricant channel is between about 0.1 nanoliter and about 1000 nanoliters.

3. The device assembly of claim 2, wherein a lubricant is disposed in the lubricant channel.

4. The device assembly of claim 1, wherein a hydraulic diameter of the lubricant channel is less than about 1 mm, and a length of the lubricant channel is substantially larger than a hydraulic diameter of the lubricant channel.

5. The device assembly of claim 1, further comprising a channel inlet in fluid communication with the lubricant channel, wherein the channel inlet is formed through an external surface of the device assembly.

6. The device assembly of claim 5, further comprising a plug disposed in the channel inlet proximate the external surface of the device assembly.

7. The device assembly of claim 1, further comprising a particle filter disposed in the lubricant channel.

8. The device assembly of claim 7, wherein the particle filter comprises a plurality of obstructions formed on an interior surface of the lubricant channel.

9. The device assembly of claim 1, wherein first and second lubricant channels are formed respectively through different interior walls of the processing region to be in fluid communication with the processing region.

10. The device assembly of claim 9, wherein lubricants are disposed in the first and second lubricant channels, and the lubricant disposed in the first lubricant channel is different from the lubricant disposed in the second lubricant channel.

11. A device assembly, comprising:
a micromechanical device enclosed within a processing region; and
a lubricant channel formed on at least one interior wall of the processing region,
wherein the lubricant channel is in fluid communication with the processing region along the entire length thereof, and the lubricant channel is configured so that a lubricant for the micromechanical device is held within the lubricant channel via surface tension of the lubricant against internal surfaces of the lubrication channel.

12. The device assembly of claim 11, wherein a width of the lubricant channel is 10 µm to 800 µm and a depth of the lubricant channel is 10 µm to 200 µm.

13. The device assembly of claim 12, wherein a volume of the lubricant channel is between about 0.1 nanoliter and about 1000 nanoliters, and a hydraulic diameter of the lubricant channel is less than about 1 mm.

14. The device assembly of claim 11, further comprising another lubricant channel formed through at least one interior wall of the processing region to be in fluid communication with the processing region, wherein a substantial length of said another lubricant channel extends into said at least one interior wall to be completely enclosed thereby.

15. The device assembly of claim 11, wherein first and second lubricant channels are formed on at least one interior wall of the processing region, wherein each of the first and second lubricant channels are in fluid communication with the processing region along the entire length thereof.

16. A packaged micromechanical device, comprising:
a lid, a base, and an interposer that define a processing region for a micromechanical device;
a micromechanical device disposed within the processing region; and
a lubricant channel formed through at least one interior wall of the processing region and in fluid communication with the processing region, wherein the lubricant channel is configured so that a lubricant for the micromechanical device is held within the lubricant channel via surface tension of the lubricant against internal surfaces of the lubrication channel.

17. The packaged micromechanical device of claim 16, wherein an epoxy layer is interposed between the lid and the interposer and between the interposer and the base.

18. The packaged micromechanical device of claim 17, wherein the lubricant channel extends into said at least one interior wall to be completely enclosed thereby.

19. The packaged micromechanical device of claim 18, further comprising a cap disposed in the lubricant channel proximate an opening of the lubricant channel into the processing region.

20. The packaged micromechanical device of claim 19, wherein the cap comprises a material that becomes porous in response to optical radiation or heating.

21. The packaged micromechanical device of claim 17, further comprising another lubricant channel formed on at least one interior wall of the processing region, wherein said another lubricant channel is in fluid communication with the processing region along the entire length thereof.

22. The packaged micromechanical device of claim 16, wherein the lid and the interposer are frit- or eutectic-bonded, and the interposer and the base are frit- or eutectic-bonded.

23. The packaged micromechanical device of claim 22, further comprising a channel inlet in fluid communication with the lubricant channel, wherein the channel inlet is formed through an external surface of the device.

24. The packaged micromechanical device of claim 23, further comprising a plug disposed in the channel inlet proximate the external surface of the device.

25. The packaged micromechanical device of claim 16, wherein the lubricant channel is formed in the base.

* * * * *